(12) United States Patent
Tega et al.

(10) Patent No.: US 9,490,328 B2
(45) Date of Patent: Nov. 8, 2016

(54) SILICON CARBIDE SEMICONDUCTOR DEVICE AND MANUFACTURING METHOD OF THE SAME

(71) Applicant: HITACHI, LTD., Tokyo (JP)

(72) Inventors: Naoki Tega, Tokyo (JP); Keisuke Kobayashi, Tokyo (JP); Koji Fujisaki, Tokyo (JP); Takashi Takahama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/897,247

(22) PCT Filed: Jun. 6, 2013

(86) PCT No.: PCT/JP2013/067576
§ 371 (c)(1),
(2) Date: Dec. 10, 2015

(87) PCT Pub. No.: WO2014/207856
PCT Pub. Date: Dec. 31, 2014

(65) Prior Publication Data
US 2016/0141371 A1    May 19, 2016

(51) Int. Cl.
*H01L 29/15*    (2006.01)
*H01L 29/16*    (2006.01)
(Continued)

(52) U.S. Cl.
CPC ..... *H01L 29/1608* (2013.01); *H01L 21/02378* (2013.01); *H01L 21/02529* (2013.01);
(Continued)

(58) Field of Classification Search
CPC ............ H01L 29/1608; H01L 29/0619; H01L 29/086; H01L 29/0865; H01L 29/0869; H01L 29/0878; H01L 29/0882; H01L 29/1095; H01L 29/167; H01L 29/66068; H01L 29/78; H01L 29/7802; H01L 21/02378; H01L 21/02529; H01L 21/0465
USPC ............................................. 257/77
See application file for complete search history.

(56) References Cited

U.S. PATENT DOCUMENTS

| 2006/0102908 | A1 | 5/2006 | Imai et al. |
| 2012/0061682 | A1* | 3/2012 | Yamamoto ............ H01L 29/086 257/77 |
| 2012/0223338 | A1 | 9/2012 | Mitani et al. |

FOREIGN PATENT DOCUMENTS

| JP | 2006-173584 A | 6/2006 |
| JP | 2009-064970 A | 3/2009 |

(Continued)

OTHER PUBLICATIONS

M. A. Capano et al., "Ionization energies and electron motilities in phosphorus-and nitrogen-impanted 4H-silicon carbide", Journal of Applied Physics 87, 8773, (2000).

(Continued)

*Primary Examiner* — Tu-Tu Ho
(74) *Attorney, Agent, or Firm* — Volpe and Koenig, P.C.

(57) ABSTRACT

In order to provide a high-performance and reliable silicon carbide semiconductor device, in a silicon carbide semiconductor device including an n-type SiC epitaxial substrate, a p-type body layer, a p-type body layer potential fixing region and a nitrogen-introduced n-type first source region formed in the p-type body layer, an n-type second source region to which phosphorus which has a solid-solubility limit higher than that of nitrogen and is easily diffused is introduced is formed inside the nitrogen-introduced n-type first source region so as to be separated from both of the p-type body layer and the p-type body layer potential fixing region.

14 Claims, 15 Drawing Sheets

PERIPHERAL FORMING REGION   ELEMENT FORMING REGION

(51) Int. Cl.
*H01L 21/04* (2006.01)
*H01L 29/66* (2006.01)
*H01L 29/78* (2006.01)
*H01L 29/06* (2006.01)
*H01L 29/08* (2006.01)
*H01L 21/02* (2006.01)
*H01L 29/10* (2006.01)
*H01L 29/167* (2006.01)

(52) U.S. Cl.
CPC ....... *H01L21/0465* (2013.01); *H01L 29/0619* (2013.01); *H01L 29/086* (2013.01); *H01L 29/0865* (2013.01); *H01L 29/0869* (2013.01); *H01L 29/0878* (2013.01); *H01L 29/0882* (2013.01); *H01L 29/1095* (2013.01); *H01L 29/167* (2013.01); *H01L 29/66068* (2013.01); *H01L 29/78* (2013.01); *H01L 29/7802* (2013.01); *H01L 21/0485* (2013.01); *H01L 29/7811* (2013.01)

(56) References Cited

FOREIGN PATENT DOCUMENTS

| JP | 2012/142585 A | 7/2012 |
| JP | 2013-105856 A | 5/2013 |
| WO | 2011/027831 A1 | 3/2011 |

OTHER PUBLICATIONS

F. Schmid et al., "Electrical activation of implanted phosphorus ions in [0001]- and [11-20]- oriented 4H-SiC", Journal of Applied Physics 91, 9182 (2002).

* cited by examiner

PERIPHERAL FORMING REGION    ELEMENT FORMING REGION

PERIPHERAL FORMING REGION    ELEMENT FORMING REGION

PERIPHERAL FORMING REGION    ELEMENT FORMING REGION

PERIPHERAL FORMING REGION    ELEMENT FORMING REGION

← PERIPHERAL FORMING REGION →   ← ELEMENT FORMING REGION →

← PERIPHERAL FORMING REGION →   ← ELEMENT FORMING REGION →

← PERIPHERAL FORMING REGION →   ← ELEMENT FORMING REGION →

PERIPHERAL FORMING REGION        ELEMENT FORMING REGION

SILICON CARBIDE SEMICONDUCTOR DEVICE AND MANUFACTURING METHOD OF THE SAME

TECHNICAL FIELD

The present invention relates to a silicon carbide semiconductor device which is constituted of a plurality of power semiconductor devices using a silicon carbide substrate, and a manufacturing method of the same.

BACKGROUND ART

Conventionally, in a power metal insulator semiconductor field effect transistor (MISFET) which is one of the power semiconductor devices, a power MISFET using a silicon (Si) substrate (hereinafter, referred to as an Si power MISFET) has been a mainstream.

However, the power MISFET using a silicon carbide (SiC) substrate (hereinafter, referred to as an SiC substrate) (hereinafter, referred to as an SiC power MISFET) can achieve higher breakdown voltage and lower loss compared to the Si power MISFET. Therefore, the SiC power MISFET has drawn attention in the field of power saving or eco-friendly inverter technologies.

Compared to the Si power MISFET, the SiC power MISFET can achieve a lower ON resistance at the same breakdown voltage. This is because the dielectric breakdown electric field intensity of silicon carbide (SiC) is about seven times as large as that of silicon (Si), so that an epitaxial layer serving as a drift layer can be made thin. However, considering the original characteristics to be obtained from silicon carbide (SiC), it cannot be said that sufficient characteristics have been obtained, and further reduction of the ON resistance has been desired from the viewpoint of high efficient utilization of energy.

One of the problems to be solved for the ON resistance of the SiC power MISFET of a DMOS (Double diffused Metal Oxide Semiconductor) structure is a parasitic contact resistance on a contact surface between a source diffusion layer and a metal electrode, which is a unique problem in the SiC power MISFET. The contact resistance component occupies about 0.5 to 1 mΩcm$^2$ in the ON resistance component. Although the On resistance depends on a rated breakdown voltage, it is about 2 to 5 mΩcm$^2$ in the case of a breakdown voltage of 600 to 1000 V. Therefore, a ratio occupied by the contact resistance is 10% or more, and the resistance increase and variation cannot be ignored. In general, in order to reduce the contact resistance, a silicide layer is formed on an SiC substrate where a contact is formed. Furthermore, it is desirable that a substrate concentration of a contact surface between the silicide layer and the source diffusion layer is high, and a range of $1\times10^{19}$ cm$^{-3}$ to $1\times10^{21}$ cm$^{-3}$ is desirable.

Nitrogen or phosphorus is used as an impurity of the source diffusion layer in an SiC power DMOS (for example, Non-Patent Documents 1 and 2). In the case where the nitrogen is used as an impurity, there is a problem in that a solid-solubility limit is low and electrical activation is not sufficiently achieved even when the impurity is implanted at a high concentration. For example, as described in Non-Patent Document 1, even when phosphorus and nitrogen are implanted at the same concentration and an activation thermal treatment is performed at the same temperature for the same period, the nitrogen is less electrically activated, and sheet resistance in the case where nitrogen is used as an impurity is ten times higher compared to the case where phosphorus is used as an impurity.

Therefore, there is a need for a technology to use phosphorus in the source diffusion layer of the contact portion. For example, as described in Japanese Patent Application Laid-Open Publication No. 2006-173584 (Patent Document 1) and Japanese Patent Application Laid-Open Publication No. 2009-064970 (Patent Document 2), a method of using phosphorus as an impurity of the source diffusion layer of the contact portion is disclosed.

RELATED ART DOCUMENTS

Patent Documents

Patent Document 1: Japanese Patent Application Laid-Open Publication No. 2006-173584
Patent Document 2: Japanese Patent Application Laid-Open Publication No. 2009-064970

Non-Patent Documents

Non-Patent Document 1: M. A. Capano et al., "Ionization energies and electron motilities in phosphorus- and nitrogen-implanted 4H-silicon carbide" Journal of Applied Physics 87, 8773, (2000)
Non-Patent Document 2: F. Schmid et al., "Electrical activation of implanted phosphorus ions in [0001]- and [11-20]-oriented 4H-SiC" Journal of Applied Physics 91, 9182, (2002)

SUMMARY OF THE INVENTION

Problems to be Solved by the Invention

However, as described in Non-Patent Document 2, for example, as a problem in the case where phosphorus is used as an impurity, there is known that the phosphorus is likely to be diffused in a direction of the (11-20) plane compared to the (0001) plane after being subjected to the activation thermal treatment. Therefore, in consideration of the problem above, the inventors have further examined the problem in the case where phosphorus is applied to the DMOS. In the DMOS, the direction of the (11-20) plane corresponds to a channel direction and a direction of a body layer potential fixing region, and a direction of the diffusion is a transverse direction with respect to the substrate. Therefore, in the case where phosphorus is used for a source diffusion layer, there is a concern that the channel is shortened and a threshold voltage is lowered. As another problem, the concentration of the body layer potential fixing region is lowered due to the diffusion of phosphorus in a transverse direction, and it becomes difficult to fix the potential of the body layer. As a result, there is a risk that a breakdown voltage failure may occur. In addition, it has been found that the width of the body layer potential fixing region is as small as about 1 μm at most, and there is a risk that the problems of a reduction in concentration and a reduction in area of the body layer potential fixing region both occur when high-concentration phosphors is diffused in the transverse direction.

An object of the invention is to provide a high-performance and reliable silicon carbide semiconductor device and a manufacturing method of the silicon carbide semiconductor device, even in the case where nitrogen or the like which is hard to be diffused and has a low solid-solubility limit is used as an impurity of a source diffusion layer and phosphorus which is easy to be diffused and has a solid-solubility limit higher than that of the nitrogen is used at a high concentration as an impurity of a source diffusion layer of a contact portion.

Means for Solving the Problems

The following is a brief description of an embodiment of a typical invention disclosed in the present application.

A silicon carbide semiconductor device includes: a substrate of a first conductivity type which includes a first main surface and a second main surface which is an opposite surface of the first main surface and is made of silicon carbide; an epitaxial layer which is formed on the first main surface of the substrate and made of silicon carbide; a body layer of a second conductivity type different from the first conductivity type, which has a first depth from a surface of the epitaxial layer and is formed in the epitaxial layer; a body layer potential fixing region of the second conductivity type, which has a second depth from the surface of the epitaxial layer and is formed in the epitaxial layer; a first source region of the first conductivity type, which has a third depth from the surface of the epitaxial layer and is formed in the body layer so as to be separated from an end portion of the body layer and to be adjacent to the body layer potential fixing region, and to which a first impurity is introduced; a second source region of the first conductivity type, which has a fourth depth from the surface of the epitaxial layer and is formed inside the first source region on a side of the end portion of the body layer and is further formed inside the first source region so as to be separated from the body layer potential fixing region on a side of the body layer potential fixing region, and to which a second impurity which has a solid-solubility limit higher than that of the first impurity and is easily diffused is introduced; a third source region of the first conductivity type, which has a fifth depth from the surface of the epitaxial layer and is formed of the first source region and the second source region overlapped with each other; a source diffusion layer region including the first source region, the second source region and the third source region; a channel region formed in the body layer between the end portion of the body layer and the first source region; a gate insulating film formed to be in contact with the channel region; a gate electrode formed to be in contact with the gate insulating film; and a drain region of the first conductivity type, which has a sixth depth from the second main surface of the surface and is formed in the substrate.

Also, in a silicon carbide semiconductor device which uses a silicon carbide substrate and includes a plurality of power semiconductor devices, in the power semiconductor device, a drift layer of a first conductivity type, a body layer of a second conductivity type different from the first conductivity type in which a channel is formed, a source region of the first conductivity type, and a body layer potential fixing region of the second conductivity type which fixes a potential of the body layer are arranged in this order in a channel length direction on a surface of a region made of silicon carbide, a gate insulating film and a gate electrode are stacked on the body layer, the drift layer is connected to a drain region of the first conductivity type, a region having a high nitrogen concentration and a region having a high phosphorus concentration are arranged in the channel length direction in the source region, and the body layer and the region having the high nitrogen concentration are in contact with each other.

Also, a manufacturing method of a silicon carbide semiconductor device, includes the steps of: (a) forming an epitaxial layer of a first conductivity type made of silicon carbide on a first main surface of a substrate of the first conductivity type made of silicon carbide; (b) forming a drain region of the first conductivity type having a sixth depth from a second main surface of the substrate in the second main surface which is an opposite surface of the first main surface of the substrate; (c) forming a first mask on a surface of the epitaxial layer so as to cover a part of the epitaxial layer and implanting an impurity of the second conductivity type to the epitaxial layer exposed from the first mask, thereby forming a body layer having a first depth from the surface of the epitaxial layer in the epitaxial layer; (d) forming a second mask on a surface of the body layer so as to cover a part of the body layer and implanting a first impurity of the first conductivity type to the body layer exposed from the second mask, thereby forming a first source region having a third depth from the surface of the epitaxial layer in the body layer; (e) forming a third mask on the surface of the epitaxial layer so as to cover the second mask; (f) forming a sidewall made of the third mask on a side surface of the second mask by processing the third mask by anisotropic dry etching and forming the third mask made of the sidewall on the surface of the epitaxial layer so as to cover a part of the first source region; and (g) implanting an impurity of the first conductivity type, which has a solid-solubility limit higher than that of the first impurity and is easily diffused, to the epitaxial layer where the body layer exposed from the second mask is formed, thereby forming a second source region having a fourth depth from the surface of the epitaxial layer.

The effects obtained by a typical embodiment of the invention disclosed in the present application will be briefly described below.

It is possible to provide a high-performance and reliable silicon carbide semiconductor device and a manufacturing method of the silicon carbide semiconductor device even in the case where nitrogen or the like which is hard to be diffused and has a low solid-solubility limit is used as an impurity of a source diffusion layer and phosphorus which is easy to be diffused and has a solid-solubility limit higher than that of the nitrogen is used at a high concentration as an impurity of a source diffusion layer of a contact portion.

BRIEF DESCRIPTIONS OF THE DRAWINGS

Figure 23:
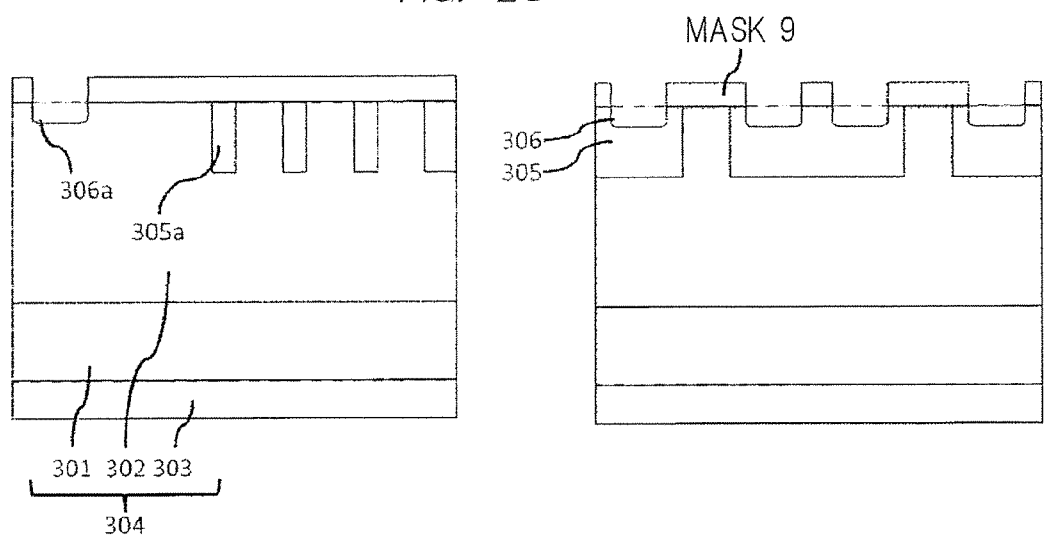
FIG. 23 is a cross-sectional view illustrating a principal part of the silicon carbide semiconductor device for describing a manufacturing process of the silicon carbide semiconductor device according to the third embodiment of the present invention.
Figure 24:
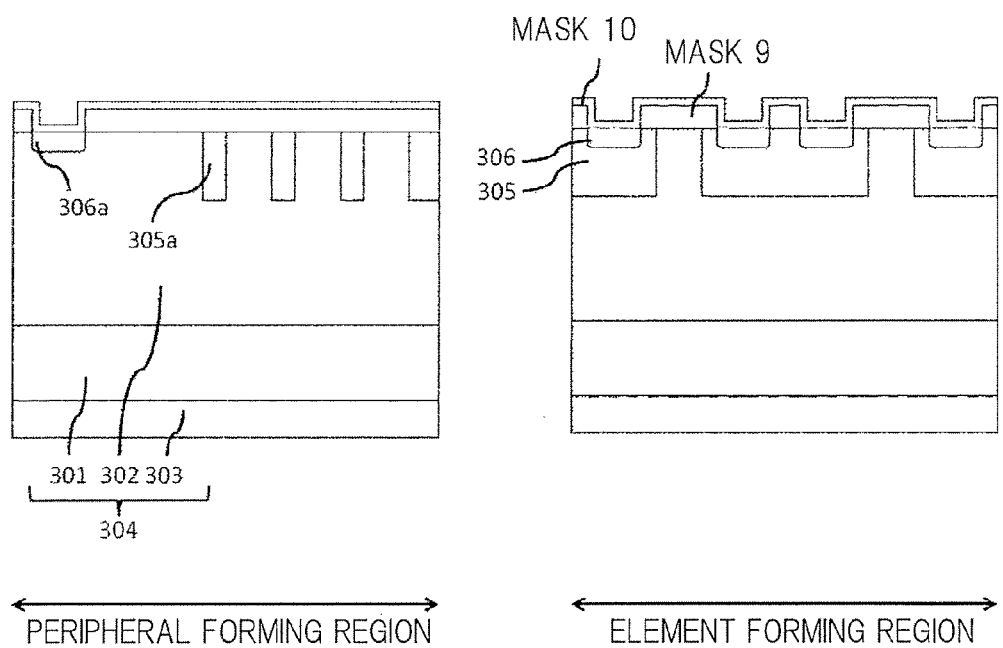
FIG. 24 is a cross-sectional view illustrating a principal part of the silicon carbide semiconductor device at the same place as that in FIG. 23 in the manufacturing process of the silicon carbide semiconductor device continued from FIG. 23.
Figure 25:
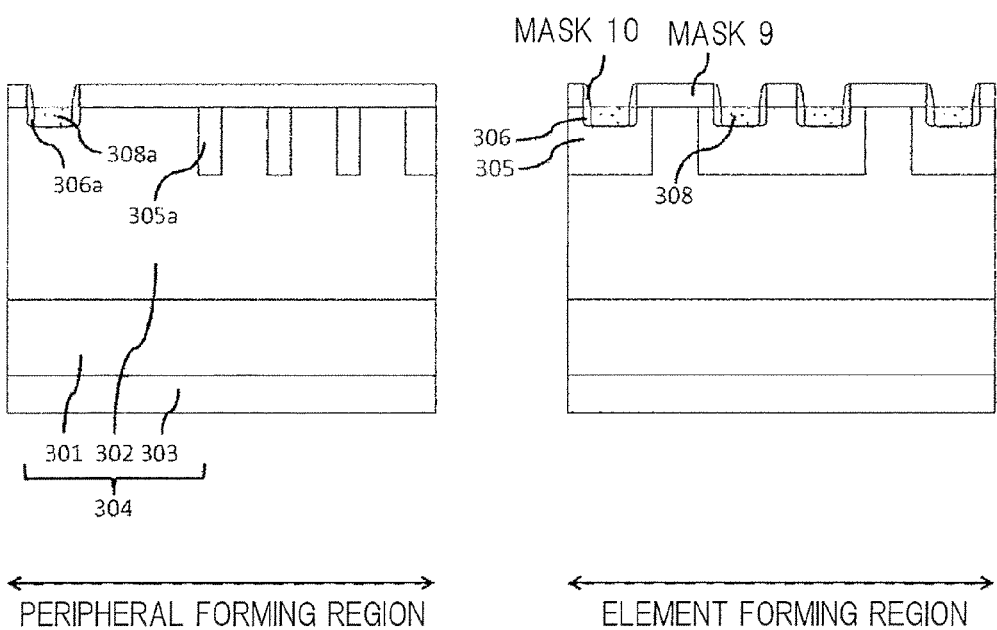
Figure 26:
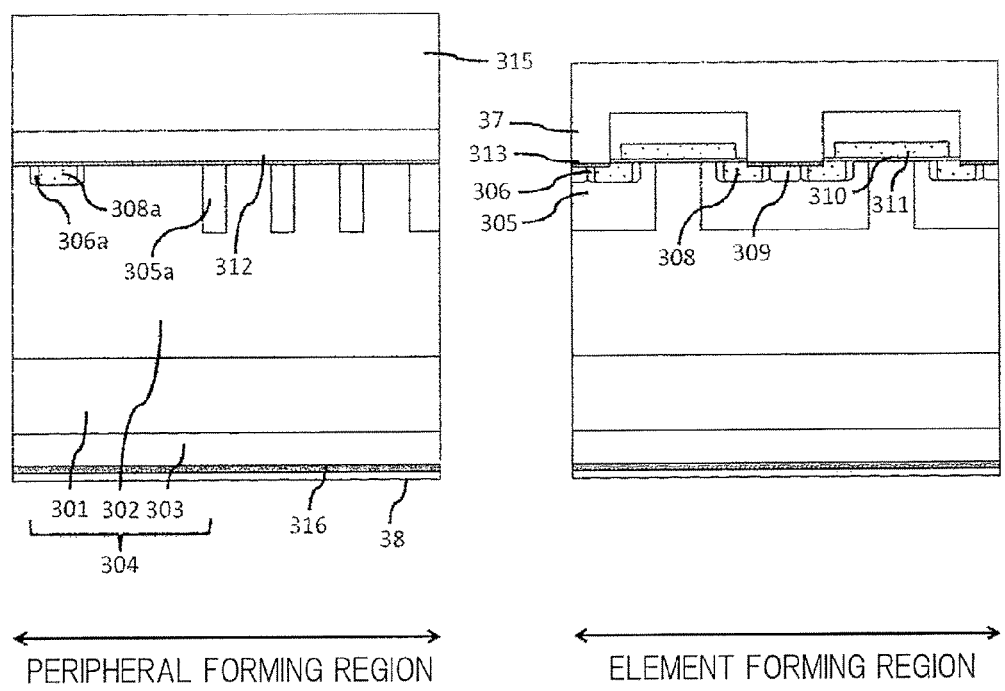

FIG. 25 is a cross-sectional view illustrating a principal part of the silicon carbide semiconductor device at the same place as that in FIG. 23 in the manufacturing process of the silicon carbide semiconductor device continued from FIG. 24; and FIG. 26 is a cross-sectional view illustrating a principal part of the silicon carbide semiconductor device at the same place as that in FIG. 23 in the manufacturing process of the silicon carbide semiconductor device continued from FIG. 25.

DETAILED DESCRIPTION OF PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the following embodiments, hatching is used even in a plan view so as to make the drawings easy to see. Also, components having the same function are denoted by the same reference characters throughout the drawings for describing the embodiments, and the repetitive description thereof is omitted. Hereinafter, embodiments of the present invention will be described in detail with reference to the accompanying drawings.

(First Embodiment)

<<Silicon Carbide Semiconductor Device>>

Figure 1:
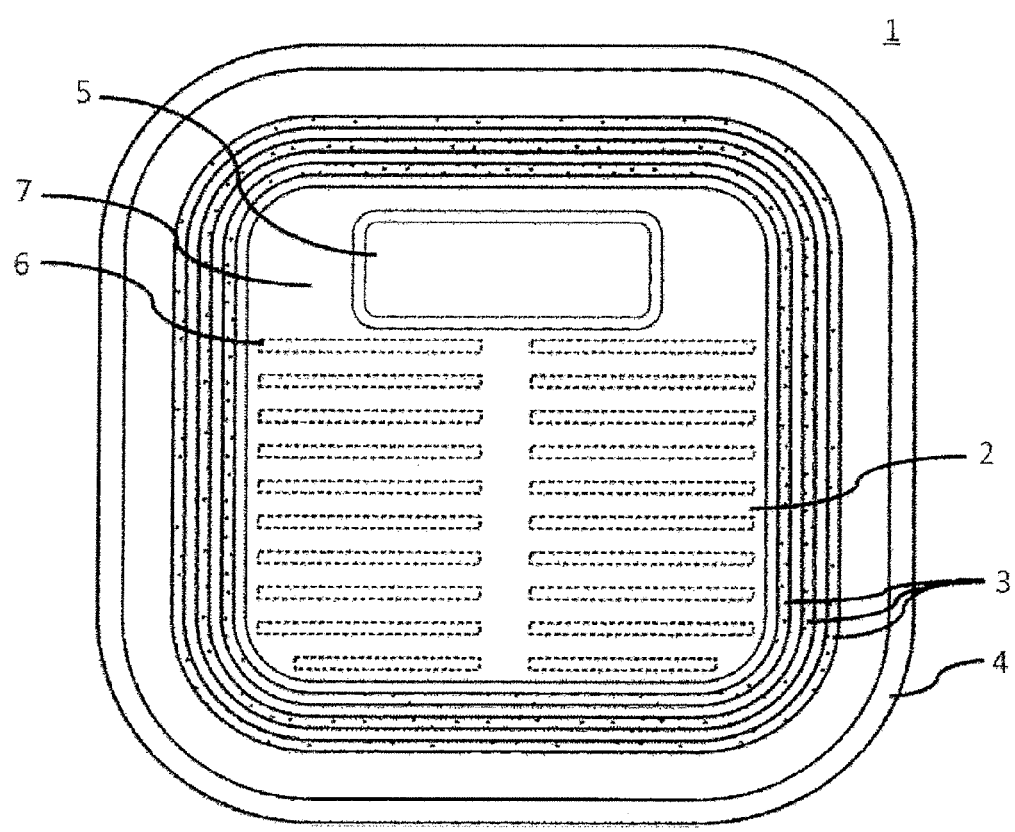
FIG. 1 is a top view illustrating a principal part of a semiconductor chip in which a silicon carbide semiconductor device constituted of a plurality of SiC power MISFETs according to a first embodiment of the present invention is mounted.
Figure 2:
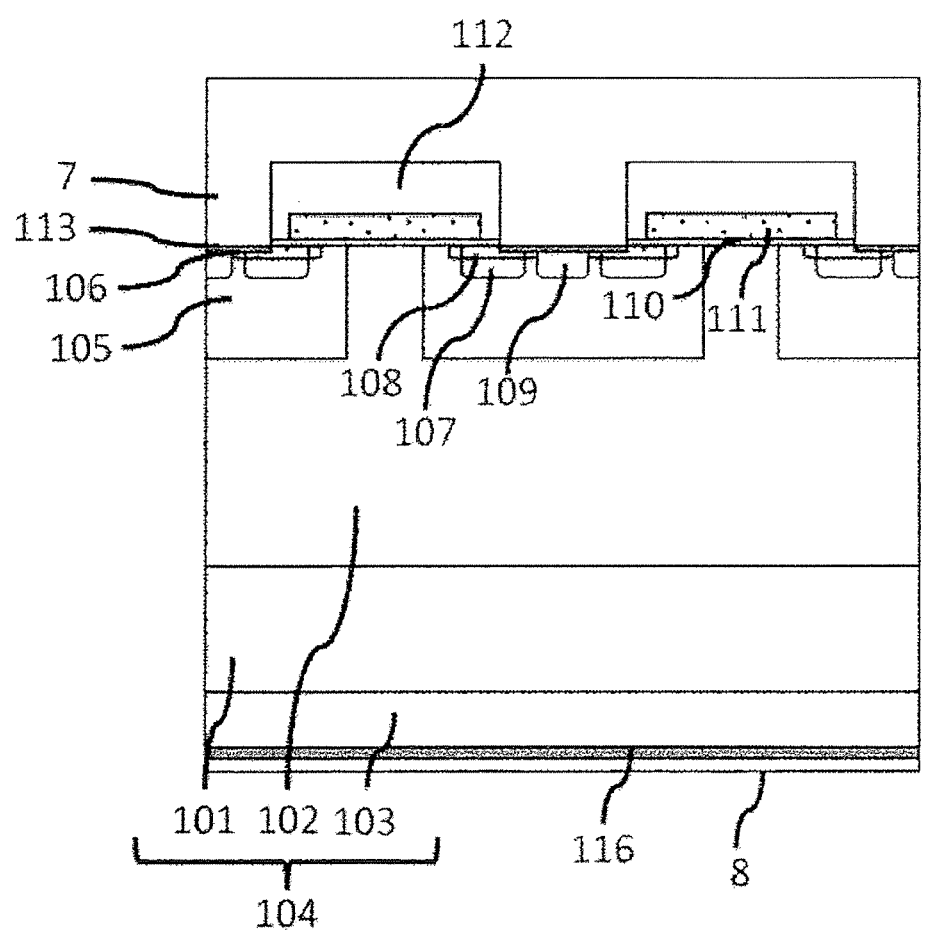
FIG. 2 is a cross-sectional view illustrating a principal part of the SiC power MISFET according to the first embodiment of the present invention.

A structure of the silicon carbide semiconductor device according to the first embodiment of the present invention will be described with reference to FIGS. 1 and 2. FIG. 1 is a top view illustrating a principal part of a semiconductor chip in which the silicon carbide semiconductor device constituted of a plurality of SiC power MISFETs is mounted, and FIG. 2 is a cross-sectional view illustrating a principal part of the SiC power MISFET. The SiC power MISFET constituting the silicon carbide semiconductor device is a MISFET of a DMOS structure.

As illustrated in FIG. 1, a semiconductor chip 1 in which the silicon carbide semiconductor device is mounted includes an active region (an SiC power MISFET forming region, an element forming region) 2 in which a plurality of n-channel SiC power MISFETs are connected in parallel and a peripheral forming region surrounding the active region 2 when seen in a plan view. In the peripheral forming region, a plurality of p-type floating field limiting rings (FLR) 3 which are formed to surround the active region 2 when seen in a plan view and an n-type guard ring 4 which is formed to surround the plurality of p-type floating field limiting rings 3 when see in a plan view are formed.

With the plurality of p-type floating field limiting rings 3 formed around the active region 2, the maximum electric field portion moves sequentially toward the outermost p-type floating field limiting ring 3 at the time of turning off, and is broken down in the outermost p-type floating field limiting ring 3, so that a high breakdown voltage can be achieved in the silicon carbide semiconductor device. In FIG. 1, an example of three p-type floating field limiting rings 3 is illustrated, but the invention is not limited thereto. In addition, the n-type guard ring 4 has a function to protect the SiC power MISFET formed in the active region 2.

The gate electrodes of the plurality of SiC power MISFETs formed in the active region 2 are connected to form a stripe pattern when seen in a plan view, and the gate electrodes of all the SiC power MISFETs are electrically connected to a gate wiring electrode 5 by lead wirings (gate bus lines) connected to each stripe pattern. The example in which the gate electrodes are formed in the stripe pattern has been described here, but the invention is not limited thereto, and the gate electrodes may be formed in, for example, a box pattern or a polygonal pattern.

In addition, the source regions of the plurality of SiC power MISFETs are electrically connected to a source wiring electrode 7 through openings 6 formed in an inter-layer insulating film which covers the plurality of SiC power MISFETs. The gate wiring electrode 5 and the source wiring electrode 7 are formed to be separated from each other, and the source wiring electrode 7 is formed in the almost entire active region 2 except the region in which the gate wiring electrode 5 is formed. In addition, the $n^+$-type drain region formed on the rear surface side of the n-type SiC epitaxial substrate is electrically connected to a drain wiring electrode 8 (not illustrated) which is formed on the entire rear surface of the n-type SiC epitaxial substrate.

Next, a structure of the SiC power MISFET according to the first embodiment will be described with reference to FIG. 2.

An $n^-$-type epitaxial layer 102 made of silicon carbide (SiC) having an impurity concentration lower than that of an $n^+$-type SiC substrate (substrate) 101 made of silicon carbide (SiC) is formed on the surface (first main surface) of the $n^+$-type SiC substrate 101, and an SiC epitaxial substrate 104 is constituted of the $n^+$-type SiC substrate 101 and the $n^-$-type epitaxial layer 102. The thickness of the $n^-$-type epitaxial layer 102 is, for example, about 5 to 20 μm.

In the $n^-$-type epitaxial layer 102, a p-type body layer (well region) 105 is formed to have a predetermined depth from the surface of the $n^-$-type epitaxial layer 102. Furthermore, in the p-type body layer 105, an $n^+$-type source region (first source region) 106 containing nitrogen as an impurity is formed to have a predetermined depth from the surface of the $n^-$-type epitaxial layer 102, and an $n^{++}$-type source region (second source region) 107 containing phosphorus as an impurity is formed in the $n^+$-type source region (first source region) 106. A source region made up of an $n^{++}$-type third source region 108 formed of the first source region and the second source region overlapped with each other is formed.

The channel region is formed between the $n^+$-type first source region 106 and an end portion of the p-type body layer.

Furthermore, in the p-type body layer 105, a $p^+$-type body layer potential fixing region 109 is formed to have a predetermined depth from the surface of the $n^-$-type epitaxial layer 102.

The depth (first depth) of the p-type body layer 105 from the surface of the epitaxial layer 102 is, for example, about 0.5 to 2.0 μm. In addition, the depth (third depth) of the $n^+$-type first source region 106 from the surface of the epitaxial layer 102 is, for example, about 0.05 to 0.25 μm. Meanwhile, the depth (fourth depth) of the $n^{++}$-type second source region 107 from the surface of the epitaxial layer 102 is, for example, about 0.1 to 0.35 μm. The depth (fifth depth) of the third source region 108 from the surface of the epitaxial layer 102 is, for example, about 0.05 to 0.25 μm.

Namely, the $n^{++}$-type second source region 107 is formed at a position separated from the end portion of the channel region in the $n^+$-type first source region 106 and the end portion of the $p^+$-type body layer potential fixing region 109.

Furthermore, the depth (second depth) of the $p^+$-type body layer potential fixing region 109 from the surface of the epitaxial layer 102 is, for example, about 0.05 to 0.35 μm. In addition, an $n^+$-type drain region 103 is formed to have a predetermined depth (sixth depth) from the rear surface (second main surface) of the SiC substrate 101.

Further, "−" and "+" are symbols indicating a relative impurity concentration of the n or p conductivity type, and for example, the impurity concentration of an n-type impurity increases in order of "$n^-$", "n", "$n^+$" and "$n^{++}$".

A desirable range of the impurity concentration of the $n^+$-type SiC substrate 101 is, for example, $1\times10^{18}$ to $1\times10^{21}$ $cm^{-3}$, a desirable range of the impurity concentration of the n⁻-type epitaxial layer 102 is, for example, $1\times10^{14}$ to $1\times10^{17}$ cm$^{-3}$, and a desirable range of the impurity concentration of the p-type body layer 105 is, for example, $1\times10^{16}$ to $1\times10^{19}$ cm$^{-3}$. In addition, a desirable range of the impurity concentration of the n⁺-type first source region 106 is, for example, $1\times10^{18}$ to $1\times10^{20}$ cm$^{-3}$ and a desirable range of the impurity concentration of the n⁺⁺-type second source region 107 is, for example, $1\times10^{19}$ to $1\times10^{21}$ cm$^{-3}$. A desirable range of the impurity concentration of the p⁺-type body layer potential fixing region 109 is, for example, $1\times10^{18}$ to $1\times10^{21}$ cm$^{-3}$.

A gate insulating film 110 is formed on the channel region, a gate electrode 111 is formed on the gate insulating film 110, and the gate insulating film 110 and the gate electrode 111 are covered with an interlayer insulating film 112. Furthermore, a part of the n⁺⁺-type third source region 108 and the p⁺-type body layer potential fixing region 109 are exposed on the bottom surface of an opening CNT formed in the interlayer insulating film 112, and a metal silicide layer 113 is formed on the surfaces thereof. Furthermore, the source wiring electrode 7 is electrically connected to a part of the n⁺⁺-type third source region 108 and the p⁺-type body layer potential fixing region 109 through the metal silicide layer 113, and the drain wiring electrode 8 is electrically connected to the n⁺-type drain region 103 through a metal silicide layer 116. Though not illustrated in the drawing, similarly, the gate electrode 111 is electrically connected to the gate wiring electrode. A source potential is applied from the outside to the source wiring electrode 7, a drain potential is applied from the outside to the drain wiring electrode 8, and a gate potential is applied from the outside to the gate wiring electrode.

Next, the features of the structure of the SiC power MISFET according to the first embodiment will be described with reference to FIG. 2 mentioned above.

As illustrated in FIG. 2 mentioned above, in the n⁺-type first source region 106, the n⁺⁺-type second source region 107 is formed to be separated from the end portion of the p⁺-type body layer potential fixing region 109 and the end portion of the channel region positioned on the opposite side thereof. The impurity of the n⁺-type first source region 106 is nitrogen, and the impurity of the n⁺⁺-type second source region 107 is phosphorus. The second source region 107 is formed deeper than the first source region 106. In addition, the n⁺⁺-type third source region 108 is formed in a portion where the first source region 106 and the second source region 107 are overlapped. Since phosphorus which is electrically active is implanted as an impurity at a high concentration in the second source region 107, a contact resistance can be reduced. In addition, since the n⁺⁺-type second source region 107 is formed to be separated from the p⁺-type body layer potential fixing region 109 and the channel, even when the phosphorus as the impurity of the second source region 107 is diffused in the transverse direction, a potential can be applied to the p-type body layer 105 without reducing the concentration of the p⁺-type body layer potential fixing region 109. In addition, since the phosphorus is not diffused up to the channel region, a short channel effect causing a reduction in threshold voltage does not occur. Therefore, it is possible to provide an SiC power DMOSFET which is not degraded in performance due to the transverse diffusion of the phosphorus while realizing a low contact resistance.

<<Manufacturing Method of Silicon Carbide Semiconductor Device>>

A manufacturing method of the silicon carbide semiconductor device according to the first embodiment of the present invention will be described in process order with reference to FIGS. 3 to 16. FIGS. 3 to 16 are cross-sectional views illustrating a principal part in which a part of the SiC power MISFET forming region (element forming region) and a part of the peripheral forming region of the silicon carbide semiconductor device are depicted in an enlarged manner. Note that three floating field limiting rings are illustrated in the peripheral forming region of FIGS. 3 to 16.

Figure 3:
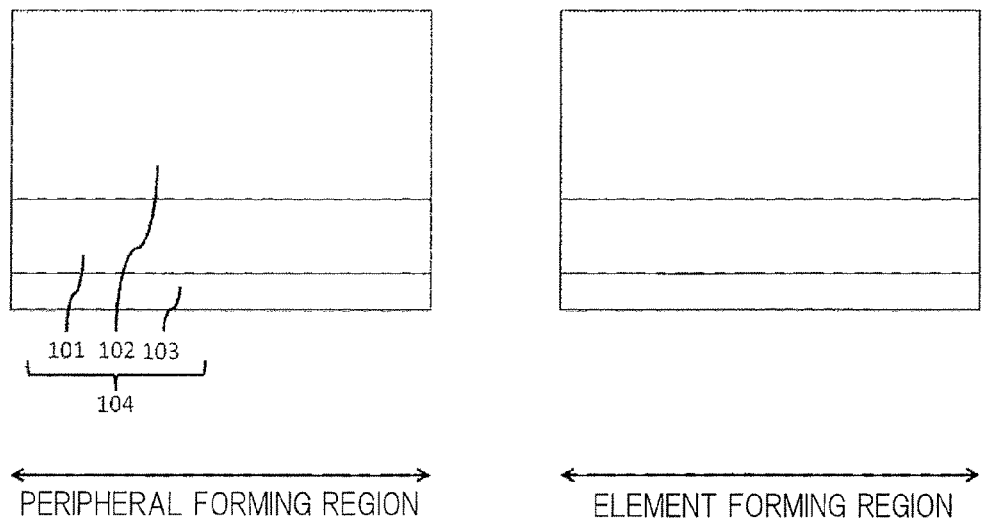
FIG. 3 is a cross-sectional view illustrating a principal part of the silicon carbide semiconductor device for describing a manufacturing process of the silicon carbide semiconductor device according to the first embodiment of the present invention.

First, the n⁺-type 4H-SiC substrate 101 is prepared as illustrated in FIG. 3. An n-type impurity is introduced to the n⁺-type SiC substrate 101. The n-type impurity is, for example, nitrogen (N), and the impurity concentration of the n-type impurity is, for example, in a range of $1\times10^{18}$ to $1\times10^{21}$ cm$^{-3}$. In addition, the n⁺-type SiC substrate 101 has both of an Si surface and a C surface, and the surface of the n⁺-type SiC substrate 101 may be the Si surface or the C surface.

Next, the n⁻-type epitaxial layer 102 made of silicon carbide (SiC) is formed on the surface (first main surface) of the n⁺-type SiC substrate 101 by an epitaxial growth method. In the n⁻-type epitaxial layer 102, an n-type impurity having an impurity concentration lower than that of the n⁺-type SiC substrate 101 is introduced. The impurity concentration of the n⁻-type epitaxial layer 102 is, for example, in a range of $1\times10^{14}$ to $1\times10^{17}$ cm$^{-3}$ though it depends on a device rating of the SiC power MISFET. In addition, the thickness of the n⁻-type epitaxial layer 102 is, for example, 5 to 20 µm. Through the process above, the SiC epitaxial substrate 104 constituted of the n⁺-type SiC substrate 101 and the n⁻-type epitaxial layer 102 is formed.

Next, the n⁺-type drain region 103 is formed on the rear surface (second main surface) of the n⁺-type SiC substrate 101 so as to have a predetermined depth (sixth depth) from the rear surface of the n⁺-type SiC substrate 101. The impurity concentration of the n⁺-type drain region 103 is, for example, in a range of $1\times10^{19}$ to $1\times10^{21}$ cm$^{-3}$.

Figure 4:
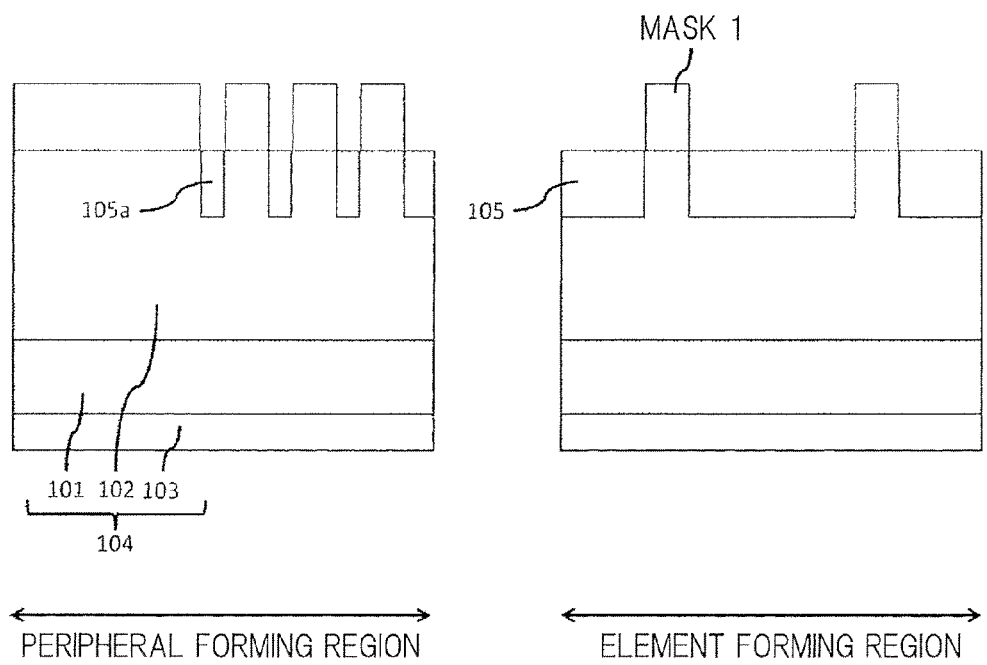
FIG. 4 is a cross-sectional view illustrating a principal part of the silicon carbide semiconductor device at the same place as that in FIG. 3 in the manufacturing process of the silicon carbide semiconductor device continued from FIG. 3.

Next, as illustrated in FIG. 4, a mask 1 is formed on the surface of the n⁻-type epitaxial layer 102. The thickness of the mask 1 is, for example, about 1.0 to 3.0 µm. The width of the mask 1 in the element forming region is, for example, about 1.0 to 5.0 µm. An inorganic material may be used as the material of the mask. In this case, an SiO₂ film is used as the material of the mask.

Next, a p-type impurity, for example, aluminum atoms (Al) is ion-implanted to the n⁻-type epitaxial layer 102 over the mask 1. In this manner, the p-type body layer 105 is formed in the element forming region of the n⁻-type epitaxial layer 102, and a p-type floating field limiting ring (hereinafter, referred to as a ring) 105a is formed in the peripheral forming region.

The depth (first depth) of the p-type body layer 105 and the p-type ring 105a from the surface of the epitaxial layer 102 is, for example, about 0.5 to 2.0 µm. In addition, the impurity concentration of the p-type body layer 105 and the p-type ring 105a is, for example, in a range of $1\times10^{16}$ to $1\times10^{19}$ cm$^{-3}$. Although the p-type ring 105a is formed in the peripheral forming region in this case, the structure of the termination portion is not limited thereto, and for example, a junction termination extension (JTE) may be employed.

Figure 5:
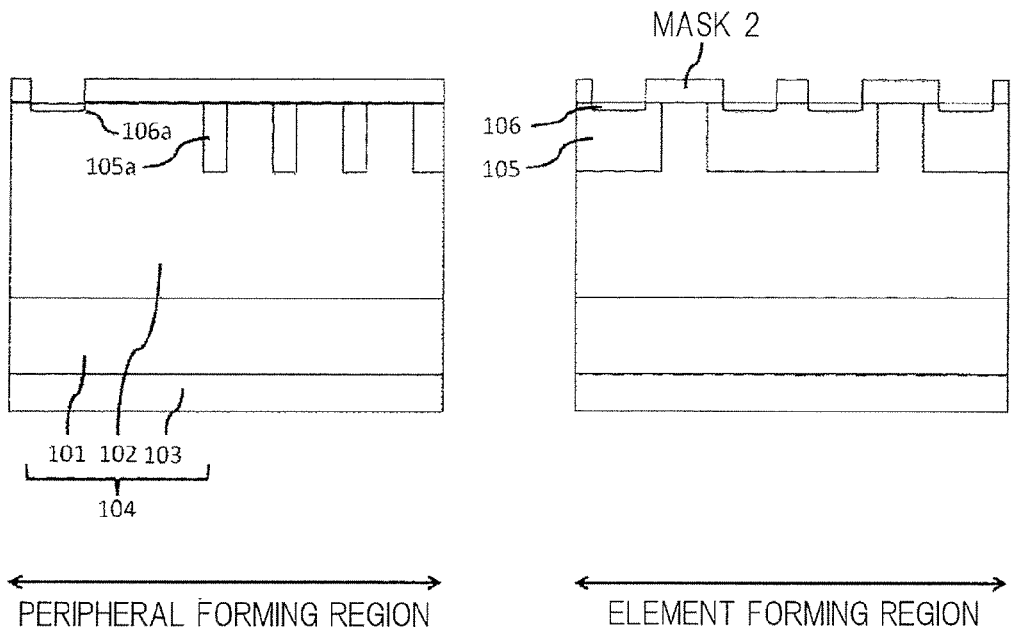
FIG. 5 is a cross-sectional view illustrating a principal part of the silicon carbide semiconductor device at the same place as that in FIG. 3 in the manufacturing process of the silicon carbide semiconductor device continued from FIG. 4.

Next, as illustrated in FIG. 5, a mask 2 is formed using an SiO₂ film after the mask 1 is removed. The thickness of the mask 2 is, for example, about 0.5 to 1.5 µm. In addition, an opening portion of the mask 2 is provided not only in the element forming region but also in the peripheral forming region.

Next, nitrogen atoms (N) are ion-implanted as an n-type impurity to the n⁻-type epitaxial layer 102 over the mask 2, so that the n⁺-type first source region 106 is formed in the element forming region and an n$^+$-type first guard ring 106a is formed in the peripheral forming region. The depth (third depth) of the n$^+$-type first source region 106 and the n$^+$-type first guard ring 106a from the surface of the epitaxial layer 102 is, for example, about 0.05 to 0.25 μm. In addition, the impurity concentration of the n$^+$-type first source region 106 and the n$^+$-type first guard ring 106a is, for example, in a range of $1\times10^{18}$ to $1\times10^{20}$ cm$^{-3}$.

Figure 6:
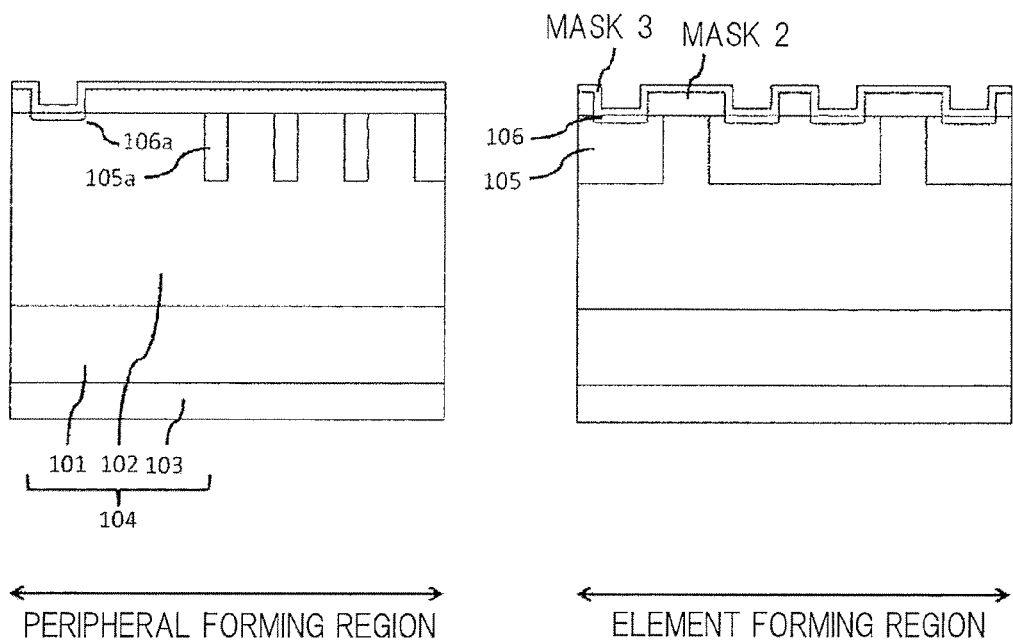
FIG. 6 is a cross-sectional view illustrating a principal part of the silicon carbide semiconductor device at the same place as that in FIG. 3 in the manufacturing process of the silicon carbide semiconductor device continued from FIG. 5.

Next, as illustrated in FIG. 6, a mask 3 is formed to cover the mask 2 and the n$^+$-type first source region 106. The film thickness of the mask 3 is, for example, about 0.1 to 0.5 μm, and the material thereof is silicon oxide (SiO$_2$).

Figure 7:
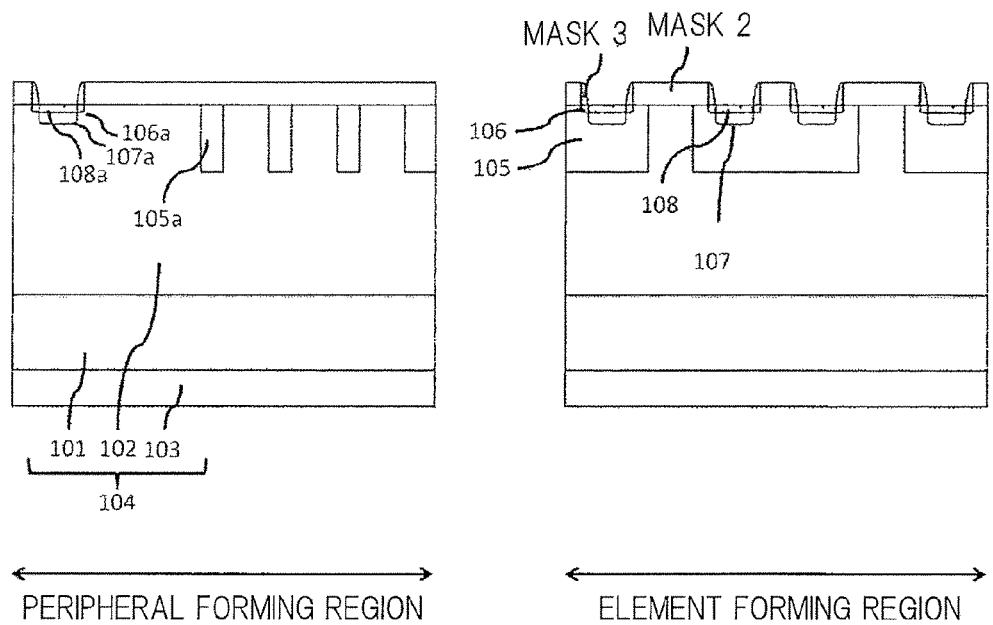
FIG. 7 is a cross-sectional view illustrating a principal part of the silicon carbide semiconductor device at the same place as that in FIG. 3 in the manufacturing process of the silicon carbide semiconductor device continued from FIG. 6.

Next, as illustrated in FIG. 7, the mask 3 is processed by an anisotropic dry etching method to form a sidewall made of the mask 3 on the side surface of the mask 2. Since the sidewall made of the mask 3 is formed, an area of the n$^{++}$-type second source region 107 when seen in a plan view to be formed in the subsequent process can be made smaller than that of the n$^+$-type first source region 106 when seen in a plan view. The width of the sidewall made of the mask 3 is determined by the film thickness of the mask 3 and is, for example, about 0.1 to 0.5 μm. Phosphorus atoms (P) are ion-implanted as an n-type impurity to the n$^{++}$-type epitaxial layer 102 over the sidewall made of the mask 3 and the mask 2, thereby forming the n$^{++}$-type second source region 107 and an n$^{++}$-type second guard ring 107a in the element forming region. The depth (fourth depth) of the n$^{++}$-type second source region 107 and the n$^{++}$-type second guard ring 107a from the surface of the epitaxial layer 102 is, for example, about 0.1 to 0.35 μm. In addition, the impurity concentration of the n$^{++}$-type second source region 107 and the n$^+$-type second guard ring 107a is, for example, in a range of $1\times10^{19}$ to $1\times10^{21}$ cm$^{-3}$.

By forming the n$^{++}$-type second source region 107 and the n$^{++}$-type second guard ring 107a to be deeper than the n$^+$-type first source region 106 and the n$^+$-type first guard ring 106a, the n$^{++}$-type third source region 108 is formed in an overlapped portion between the n$^+$-type first source region 106 and the n$^{++}$-type second source region 107, and an n$^{++}$-type third guard ring 108a is formed in an overlapped portion between the n$^+$-type first guard ring 106a and the n$^{++}$-type second guard ring 107a. The depth (fifth depth) of the third source region 108 and the third guard ring 108a from the surface of the epitaxial layer 102 is, for example, about 0.05 to 0.25 μm.

In the first embodiment, since the source region (the n$^+$-type first source region 106, the n$^{++}$-type second source region 107 and the n$^{++}$-type third source region 108) of the element forming region and the guard ring (the n$^+$-type first guard ring 106a, the n$^{++}$-type second guard ring 107a and the n$^{++}$-type third guard ring 108a) of the peripheral forming region are formed at the same time, the source region and the guard ring have the same impurity distribution in the depth direction.

Figure 8:
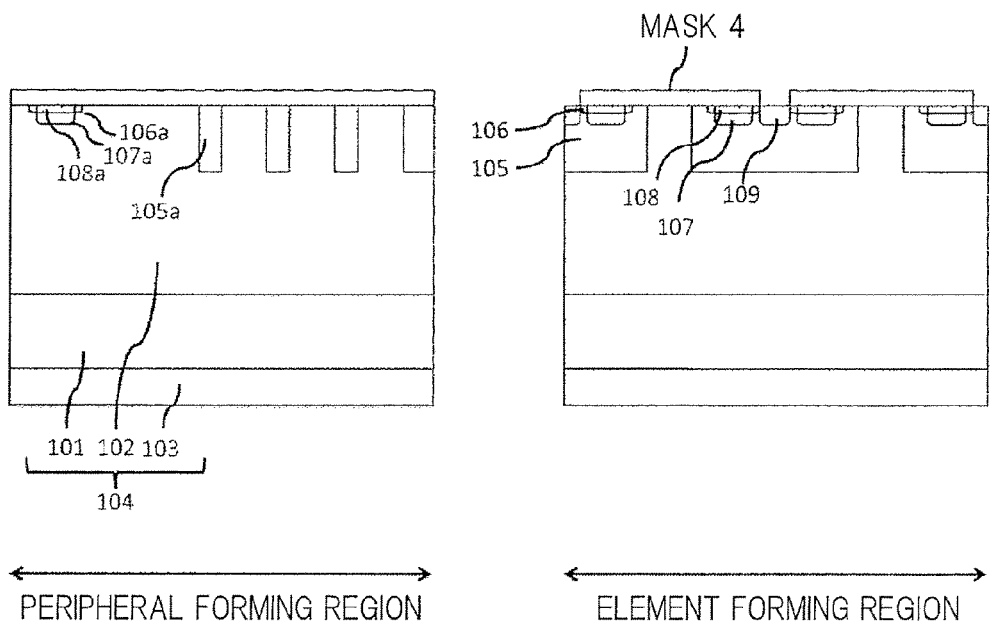
FIG. 8 is a cross-sectional view illustrating a principal part of the silicon carbide semiconductor device at the same place as that in FIG. 3 in the manufacturing process of the silicon carbide semiconductor device continued from FIG. 7.

Next, as illustrated in FIG. 8, a mask 4 is formed using an SiO$_2$ film after the mask 2 and the mask 3 are removed. The mask 4 is provided with an opening portion only in a region where the p$^+$-type body layer potential fixing region 109 for fixing the potential of the p-type body layer 105 is formed in the subsequent process. The thickness of the mask 4 is, for example, about 0.5 to 1.5 μm.

Next, the p-type impurity, for example, aluminum atoms (Al) is ion-implanted to the n$^-$-type epitaxial layer 102 over the mask 4, thereby forming the p$^+$-type body layer potential fixing region 109. The depth (second depth) of the p$^+$-type body layer potential fixing region 109 from the surface of the epitaxial layer 102 is, for example, about 0.05 to 0.35 μm.

The impurity concentration of the p$^+$-type body layer potential fixing region 109 is, for example, in a range of $1\times10^{18}$ to $1\times10^{21}$ cm$^{-3}$.

Next, after the mask 4 is removed, though not illustrated in the drawing, a carbon (C) film is deposited on the front surface and the rear surface of the SiC epitaxial substrate 104 by, for example, a plasma CVD method. The thickness of the carbon (C) film is, for example, about 0.03 μm. After covering the front surface and the rear surface of the SiC epitaxial substrate 104 with the carbon (C) film, thermal treatment is performed on the SiC epitaxial substrate 104 at a temperature of 1500° C. or more for about 2 to 3 minutes. In this manner, the impurities which have been ion-implanted to the SiC epitaxial substrate 104 are activated. After the thermal treatment, the carbon (C) film is removed by, for example, an oxygen plasma treatment.

Figure 9:
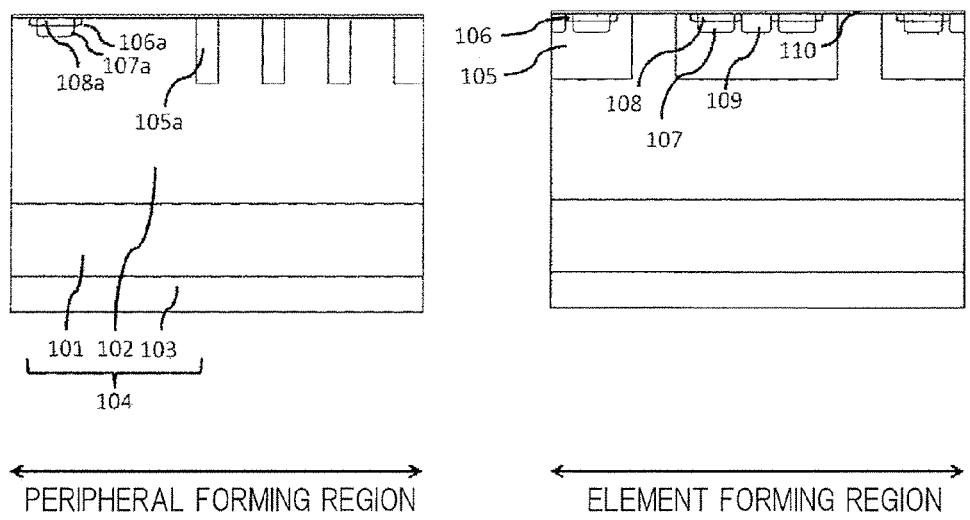
FIG. 9 is a cross-sectional view illustrating a principal part of the silicon carbide semiconductor device at the same place as that in FIG. 3 in the manufacturing process of the silicon carbide semiconductor device continued from FIG. 8.

Next, as illustrated in FIG. 9, the gate insulating film 110 is formed on the surface of the n$^-$-type epitaxial layer 102. The gate insulating film 110 is made of an SiO$_2$ film by, for example, a thermal CVD method. The thickness of the gate insulating film 110 is, for example, about 0.05 to 0.15 μm.

Figure 10:
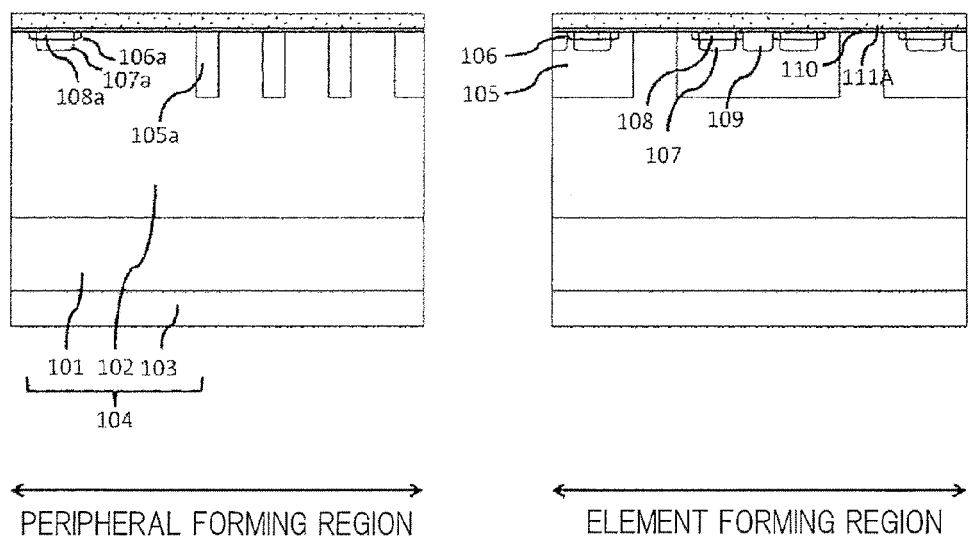
FIG. 10 is a cross-sectional view illustrating a principal part of the silicon carbide semiconductor device at the same place as that in FIG. 3 in the manufacturing process of the silicon carbide semiconductor device continued from FIG. 9.

Next, as illustrated in FIG. 10, an n-type polycrystalline silicon (Si) film 111A is formed on the gate insulating film 110. The thickness of the n-type polycrystalline silicon (Si) film 111A is, for example, about 0.2 to 0.5 μm.

Figure 11:
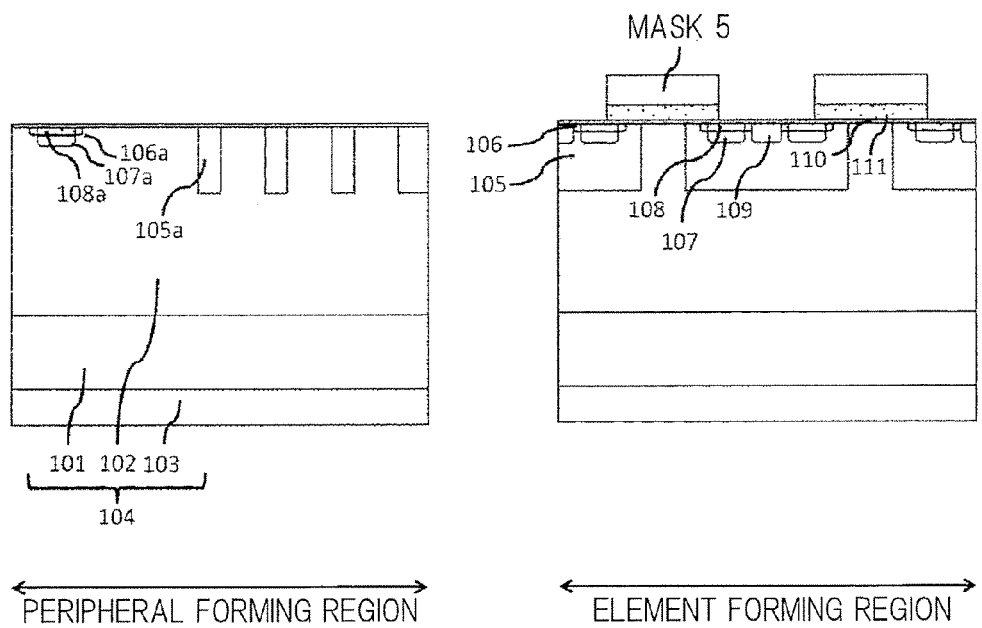
FIG. 11 is a cross-sectional view illustrating a principal part of the silicon carbide semiconductor device at the same place as that in FIG. 3 in the manufacturing process of the silicon carbide semiconductor device continued from FIG. 10.

Next, as illustrated in FIG. 11, the polycrystalline silicon (Si) film 111A is processed by the dry etching method with using a mask 5 (photoresist film), thereby forming the gate electrode 111.

Figure 12:
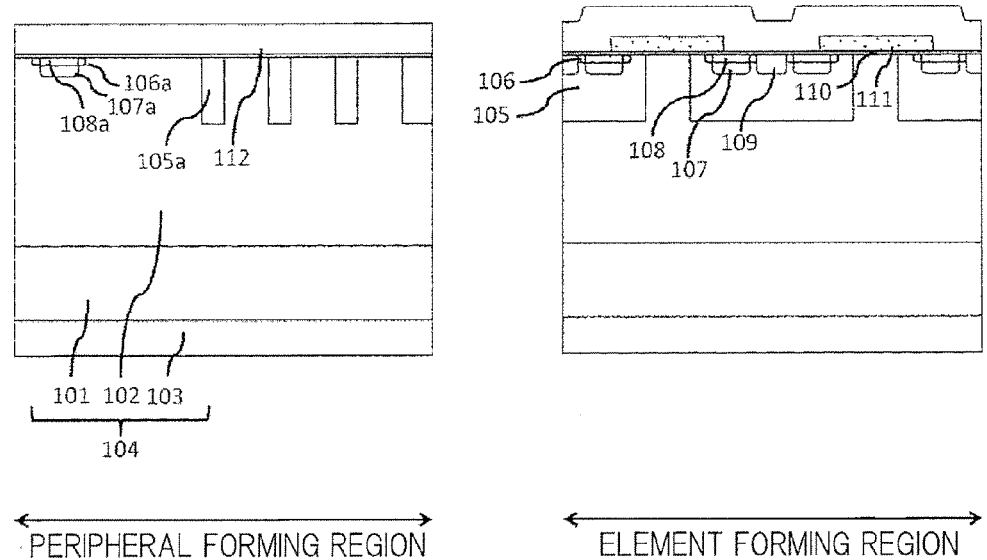
FIG. 12 is a cross-sectional view illustrating a principal part of the silicon carbide semiconductor device at the same place as that in FIG. 3 in the manufacturing process of the silicon carbide semiconductor device continued from FIG. 11.

Next, as illustrated in FIG. 12, after the mask 5 is removed, the interlayer insulating film 112 is formed on the surface of the n$^-$-type epitaxial layer 102 by, for example, the plasma CVD method so as to cover the gate electrode 111 and the gate insulating film 110.

Figure 13:
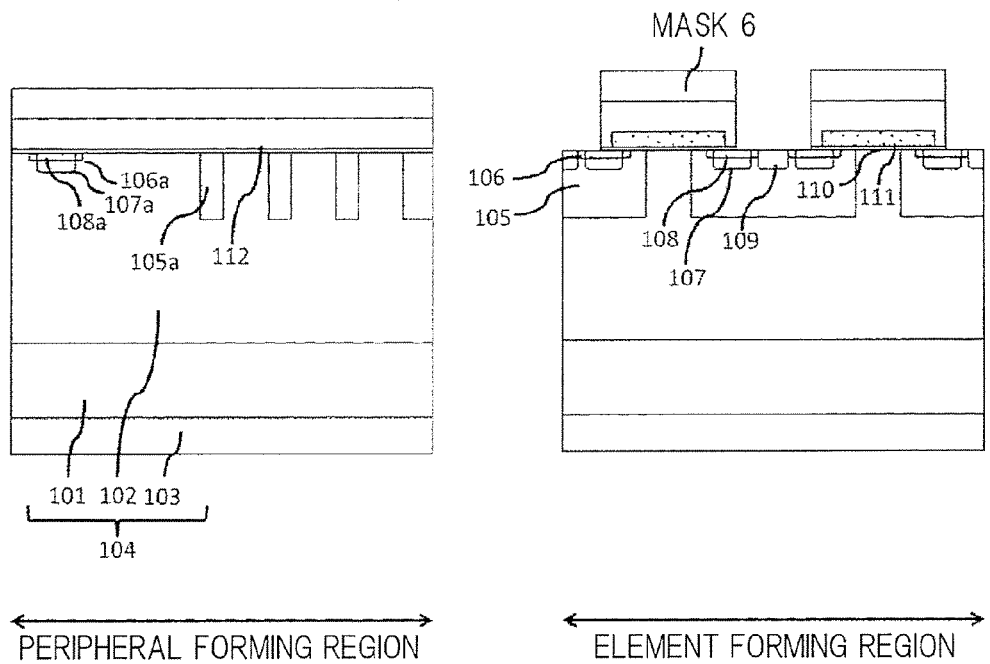
FIG. 13 is a cross-sectional view illustrating a principal part of the silicon carbide semiconductor device at the same place as that in FIG. 3 in the manufacturing process of the silicon carbide semiconductor device continued from FIG. 12.

Next, as illustrated in FIG. 13, the interlayer insulating film 112 and the gate insulating film 110 are processed by the dry etching method with using a mask 6 (photoresist film), thereby forming an opening CNT which reaches a part of the n$^{++}$-type third source region 108, a part of the n$^+$-type first source region 106 and the p$^+$-type body layer potential fixing region 109.

Figure 14:
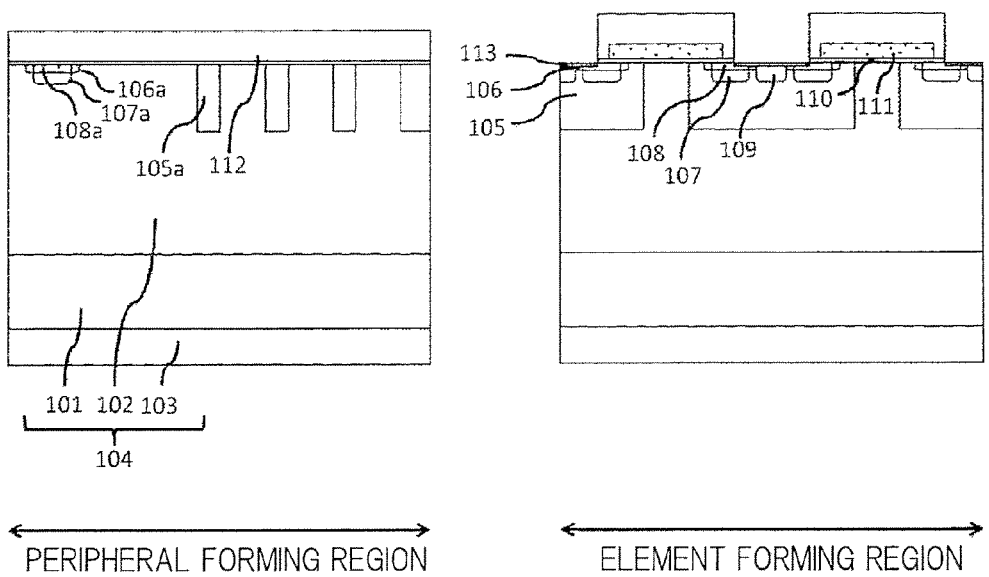
FIG. 14 is a cross-sectional view illustrating a principal part of the silicon carbide semiconductor device at the same place as that in FIG. 3 in the manufacturing process of the silicon carbide semiconductor device continued from FIG. 13.

Next, as illustrated in FIG. 14, after the mask 6 is removed, the metal silicide layer 113 is formed on the respective surfaces of a part of the n$^{++}$-type third source region 108, a part of the n$^+$-type first source region 106 and the p$^+$-type body layer potential fixing region 109 exposed on the bottom surface of the opening CNT.

First, though not illustrated in the drawing, a first metal film, for example, nickel (Ni) is deposited on the surface of the n$^-$-type epitaxial layer 102 so as to cover the interlayer insulating film 112 and the inside of the opening CNT (side surface and bottom surface) by, for example, a sputtering method. The thickness of the first metal film is, for example, about 0.05 μm. Subsequently, a silicide thermal treatment is performed at 600 to 1000° C. to make the first metal film and the n$^-$-type epitaxial layer 102 react with each other on the bottom surface of the opening CNT, thereby forming the metal silicide layer 113, for example, a nickel silicide (NiSi) layer on the respective surfaces of a part of the n$^{++}$-type third source region 108, a part of the n$^+$-type first source region 106 and the p$^+$-type body layer potential fixing region 109 exposed on the bottom surface of the opening CNT. Then, the unreacted first metal film is removed by a wet etching method. In the wet etching method, for example, a sulfuric acid/hydrogen peroxide mixture is used.

Figure 15:
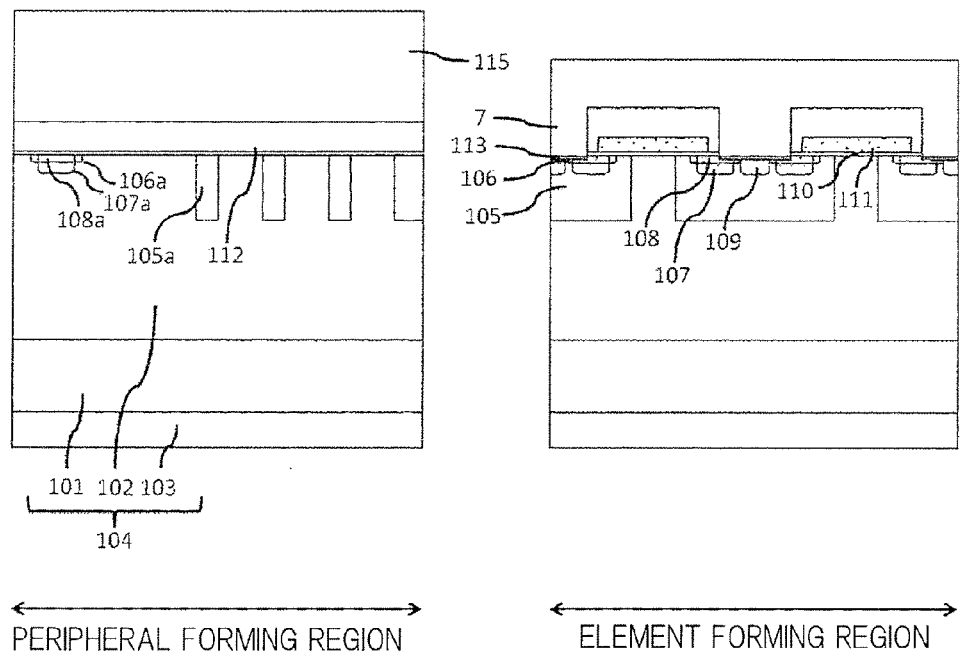
FIG. 15 is a cross-sectional view illustrating a principal part of the silicon carbide semiconductor device at the same place as that in FIG. 3 in the manufacturing process of the silicon carbide semiconductor device continued from FIG. 14.

Next, as illustrated in FIG. 15, a third metal film, for example, a stacked film made up of a titanium (Ti) film, a titanium nitride (TiN) film and an aluminum (Al) film is deposited on the interlayer insulating film 112 including the inside of the opening CNT reaching the metal silicide film 113 formed of the respective surfaces of a part of the $n^{++}$-type third source region 108, a part of the $n^+$-type first source region 106 and the $p^+$-type body layer potential fixing region 109 and the inside of the opening (not illustrated) reaching the gate electrode 111. A desirable thickness of the aluminum (Al) film is, for example, 2.0 μm or more. Subsequently, the third metal film is processed to form the source wiring electrode 7 electrically connected to a part of the $n^{++}$-type third source region 108 through the metal silicide layer 113 and the gate wiring electrode (not illustrated) electrically connected to the gate electrode 111. Note that the gate wiring electrode is fabricated by the same process as that of the source wiring electrode except the polycrystalline silicon film.

Next, though not illustrated in the drawing, an $SiO_2$ film or a polyimide film is stacked as a passivation film so as to cover the gate wiring electrode and the source wiring electrode 7.

Next, as illustrated in FIG. 15, the passivation film is processed to form a passivation film 115.

Next, though not illustrated in the drawing, a second metal film is deposited on the rear surface of the $n^+$-type SiC substrate 101 by, for example, the sputtering method. The thickness of the second metal film is, for example, about 0.1 μm.

Figure 16:
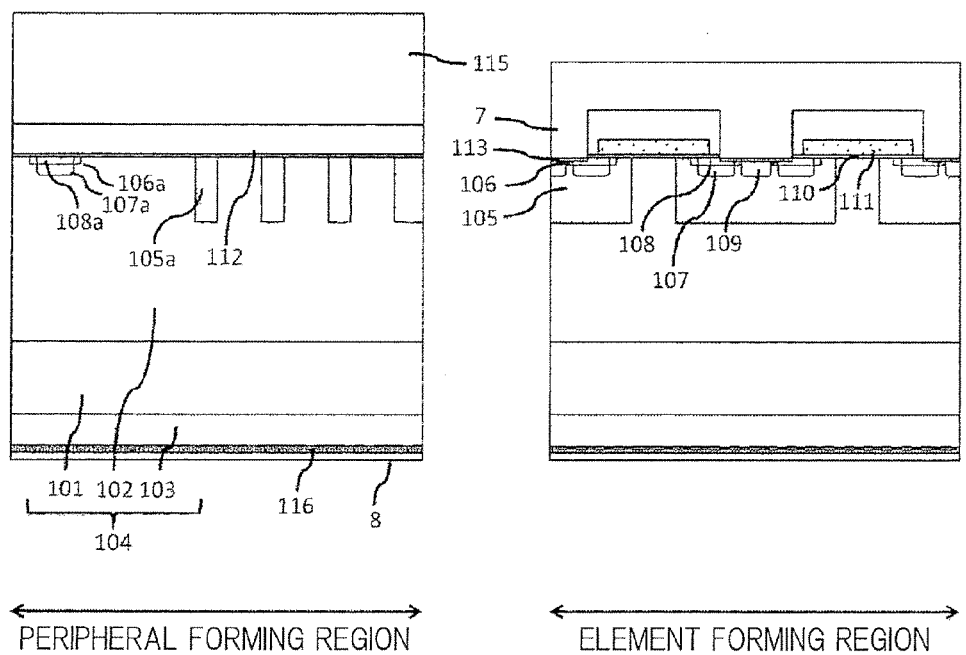
FIG. 16 is a cross-sectional view illustrating a principal part of the silicon carbide semiconductor device at the same place as that in FIG. 3 in the manufacturing process of the silicon carbide semiconductor device continued from FIG. 15.

Next, as illustrated in FIG. 16, the second metal film is reacted with the $n^+$-type SiC substrate 101 by a laser silicide thermal treatment, thereby forming the metal silicide layer 116 so as to cover the $n^+$-type drain region 103 formed on the rear surface side of the $n^+$-type SiC substrate 101. Subsequently, the drain wiring electrode 8 is formed so as to cover the metal silicide layer 116. As the drain wiring electrode 8, a stacked film made up of a Ti film, an Ni film and a gold (Au) film is deposited to have a thickness of 0.5 to 1 μm.

Thereafter, external wirings are electrically connected to the source wiring electrode 7, the gate wiring electrode (not illustrated) and the drain wiring electrode 8.

As described above, according to the first embodiment, the $n^{++}$-type second source region 107 is formed inside the $n^+$-type first source region 106 so as to be separated from the end portion of the $p^+$-type body layer potential fixing region 109 and the end portion of the channel region positioned on the opposite side thereof. The impurity of the $n^+$-type first source region 106 is nitride, and the impurity of the $n^{++}$-type second source region 107 is phosphorus. Since phosphorus which is electrically active is implanted as an impurity at a high concentration in the second source region 107, a contact resistance can be reduced. In addition, since the $n^{++}$-type second source region 107 is formed to be separated from the $p^+$-type body layer potential fixing region 109 and the channel, even when the phosphorus as the impurity of the second source region 107 is diffused in the transverse direction, a potential can be applied to the p-type body layer 105 without reducing the concentration of the $p^+$-type body layer potential fixing region 109. In addition, since the phosphorus is not diffused up to the channel region, a short channel effect causing a reduction in threshold voltage does not occur. Therefore, it is possible to provide an SiC power DMOSFET which is not degraded in performance due to the transverse diffusion of the phosphorus while realizing a low contact resistance.

As described above, according to this embodiment, it is possible to provide a high-performance and reliable silicon carbide semiconductor device and a manufacturing method of the silicon carbide semiconductor device even in the case where nitrogen or the like which is hard to be diffused and has a low solid-solubility limit is used as an impurity of a source diffusion layer and phosphorus which is easy to be diffused and has a solid-solubility limit higher than that of the nitrogen is used at a high concentration as an impurity of a source diffusion layer of a contact portion.

(Second Embodiment)

Figure 17:
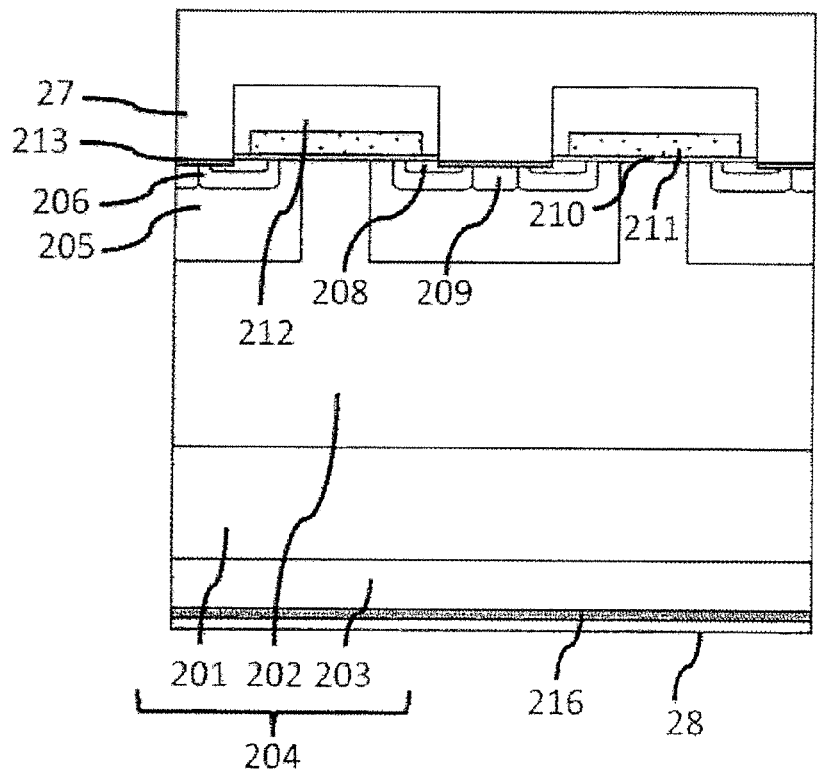
FIG. 17 is a cross-sectional view illustrating a principal part of an SiC power MISFET according to a second embodiment of the present invention.

A difference between the second embodiment and the above-mentioned first embodiment lies in a method of forming the source region. Namely, in the second embodiment, an $n^{++}$-type second source region 208 is made shallower than an $n^+$-type first source region 206 as illustrated in FIG. 17, and thus the second source region 208 becomes equivalent to the third source region. Note that the reference numeral 201 indicates an $n^+$-type SiC substrate (substrate), the reference numeral 202 indicates an $n^-$-type epitaxial layer, the reference numeral 203 indicates an $n^+$-type drain region, the reference numeral 204 indicates an SiC epitaxial substrate, the reference numeral 205 indicates a p-type body layer (well region), the reference numeral 209 indicates a $p^+$-type body layer potential fixing region, the reference numeral 210 indicates a gate insulating film, the reference numeral 211 indicates a gate electrode, the reference numeral 212 indicates an interlayer insulating film, the reference numeral 213 indicates a metal silicide layer, the reference numeral 27 indicates a source wiring electrode, the reference numeral 216 indicates a metal silicide layer, and the reference numeral 28 indicates a drain wiring electrode.

<<Manufacturing Method of Silicon Carbide Semiconductor Device>>

A manufacturing method of the silicon carbide semiconductor device according to the second embodiment will be described in process order with reference to FIGS. 18 to 21. FIGS. 18 to 21 are cross-sectional views illustrating a principal part in which a part of the SiC power MISFET forming region (element forming region) and a part of the peripheral forming region of the silicon carbide semiconductor device are depicted in an enlarged manner.

In the same manner as the first embodiment mentioned above, as illustrated in FIG. 18, the $n^-$-type epitaxial layer 202 is formed on the surface (first main surface) of the $n^+$-type SiC substrate (substrate) 201, and the SiC epitaxial substrate 204 constituted of the $n^+$-type SiC substrate 201 and the $n^-$-type epitaxial layer 202 is formed. The impurity concentration of the $n^+$-type SiC substrate 201 is, for example, in a range of $1\times10^{18}$ to $1\times10^{21}$ $cm^{-3}$, and the impurity concentration of the $n^-$-type epitaxial layer 202 is, for example, in a range of $1\times10^{14}$ to $1\times10^{17}$ $cm^{-3}$. Subsequently, the $n^+$-type drain region 203 is formed on the rear surface (second main surface) of the $n^+$-type SiC substrate 201. The impurity concentration of the $n^+$-type drain region 203 is, for example, in a range of $1\times10^{19}$ to $1\times10^{21}$ $cm^{-3}$.

Next, a mask (not illustrated) made of, for example, an $SiO_2$ film is formed on the surface of the $n^-$-type epitaxial layer 202. Subsequently, the p-type impurity, for example, aluminum atoms (Al) is ion-implanted to the $n^-$-type epitaxial layer 202 over the mask. In this manner, the p-type body layer (well region) 205 is formed in the element forming region on the surface side of the $n^-$-type epitaxial layer 202, and a p-type ring 205a is formed in the peripheral forming region. The depth (first depth) of the p-type body layer 205 and the p-type ring 205a from the surface of the epitaxial layer 202 is, for example, about 0.5 to 2.0 μm. In addition, the impurity concentration of the p-type body layer 205 and the p-type ring 205a is, for example, in a range of $1\times10^{16}$ to $1\times10^{19}$ cm$^{-3}$.

Figure 18:
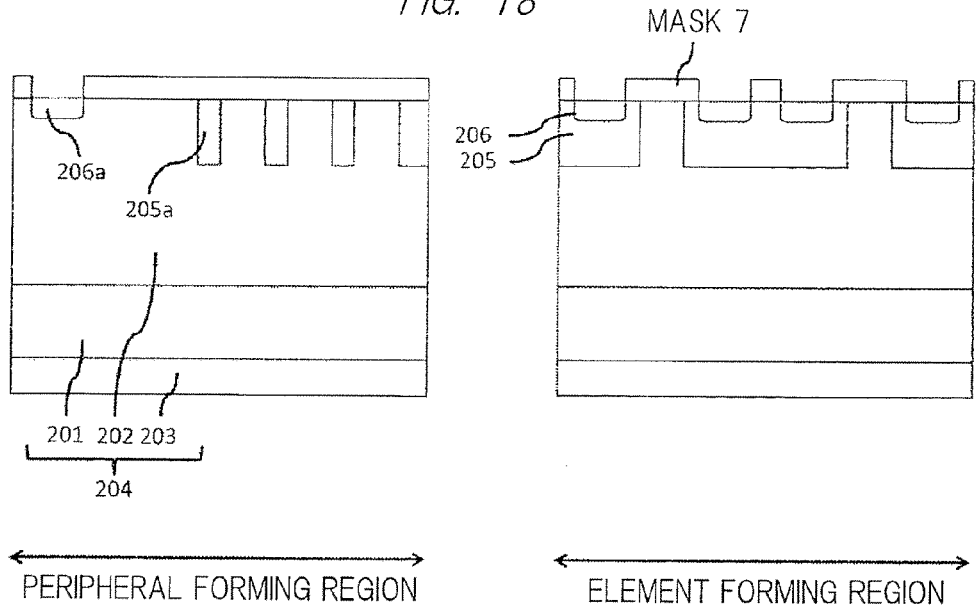
FIG. 18 is a cross-sectional view illustrating a principal part of the silicon carbide semiconductor device for describing a manufacturing process of the silicon carbide semiconductor device according to the second embodiment of the present invention.

Next, as illustrated in FIG. 18, a mask 7 (SiO$_2$ film) is formed after the mask is removed. The thickness of the mask 7 is, for example, about 0.5 to 1.5 µm. In addition, the opening portion of the mask 7 is provided not only in the element forming region but also in the peripheral forming region.

Next, nitrogen atoms (N) are ion-implanted as an n-type impurity to the n$^-$-type epitaxial layer 202 over the mask 7, so that the n$^+$-type first source region 206 is formed in the element forming region and an n$^+$-type first guard ring 206a is formed in the peripheral forming region. The depth (third depth) of the n$^+$-type first source region 206 and the n$^+$-type first guard ring 206a from the surface of the epitaxial layer 202 is, for example, about 0.1 to 0.35 µm. In addition, the impurity concentration of the n$^+$-type first source region 206 and the n$^+$-type first guard ring 206a is, for example, in a range of $1\times10^{18}$ to $1\times10^{20}$ cm$^{-3}$.

Figure 19:
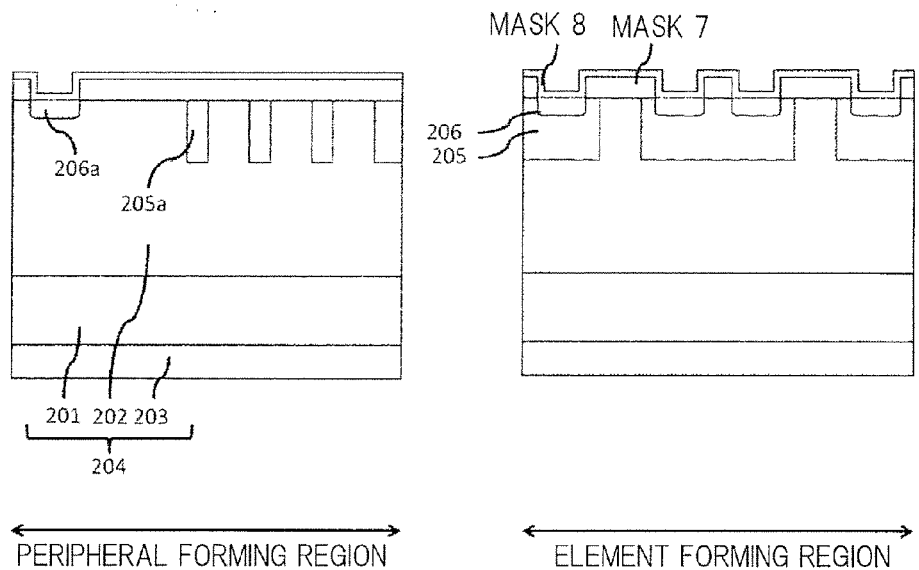
FIG. 19 is a cross-sectional view illustrating a principal part of the silicon carbide semiconductor device at the same place as that in FIG. 18 in the manufacturing process of the silicon carbide semiconductor device continued from FIG. 18.

Next, as illustrated in FIG. 19, a mask 8 is formed so as to cover and surround the mask 7 and the n$^+$-type first source region 206. The film thickness of the mask 8 is, for example, about 0.1 to 0.5 µm, and the material thereof is SiO$_2$.

Figure 20:
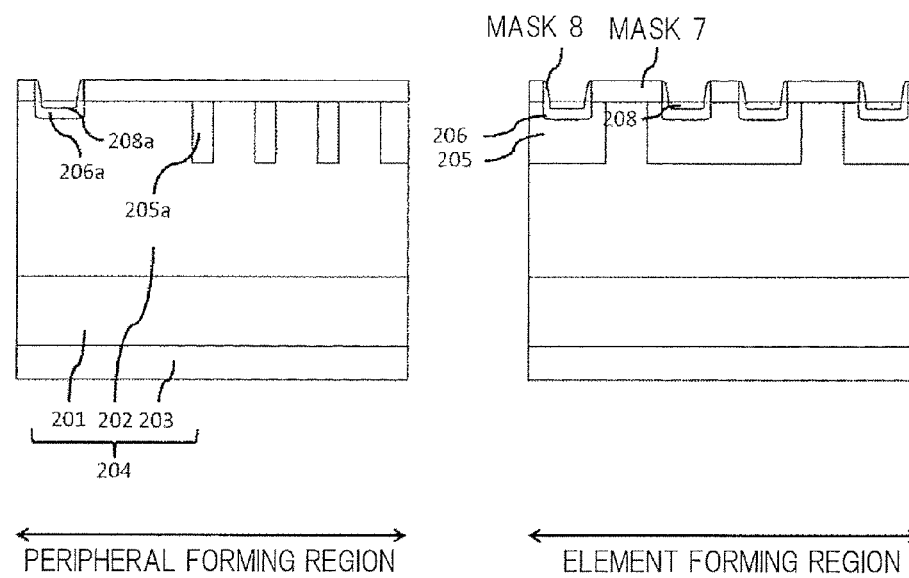
FIG. 20 is a cross-sectional view illustrating a principal part of the silicon carbide semiconductor device at the same place as that in FIG. 18 in the manufacturing process of the silicon carbide semiconductor device continued from FIG. 19.

Next, as illustrated in FIG. 20, the mask 8 is processed by the anisotropic dry etching method to form a sidewall made of the mask 8 on the side surface of the mask 7. Since the sidewall made of the mask 8 is formed, an area of the n$^{++}$-type second source region 208 when seen in a plan view to be formed in the subsequent process can be made smaller than that of the n$^+$-type first source region 206 when seen in a plan view. Phosphors atoms (P) are ion-implanted as an n-type impurity to the n$^-$-type epitaxial layer 202 over the sidewall made of the mask 8 and the mask 7, thereby forming the n$^{++}$-type second source region 208 and an n$^{++}$-type second guard ring 208a in the element forming region. The depth (fourth depth) of the n$^{++}$-type second source region 208 and the n$^{++}$-type second guard ring 208a from the surface of the epitaxial layer 202 is, for example, about 0.05 to 0.25 µm. In addition, the impurity concentration of the n$^{++}$-type second source region 208 and the n$^{++}$-type second guard ring 208a is, for example, in a range of $1\times10^{19}$ to $1\times10^{21}$ cm$^{-3}$.

Since the n$^{++}$-type second source region 208 is formed to be shallower than the n$^+$-type first source region 206, an n$^{++}$-type third source region is formed in an overlapped portion between the n$^+$-type first source region 206 and the n$^{++}$-type second source region 208. At this time, the third source region and the second source region are formed in common. Since the n$^{++}$-type second guard ring 208a is formed to be shallower than the n$^+$-type first guard ring 206a, the n$^{++}$-type third guard ring is formed in the overlapped portion between the n$^+$-type first guard ring 206a and the n$^{++}$-type second guard ring 208a. At this time, the third guard ring and the second guard ring 208a are formed in common. In the second embodiment, since the source region (the n$^+$-type first source region 206 and the n$^{++}$-type second source region 208) of the element forming region and the guard ring (the n$^+$-type first guard ring 206a and the n$^{++}$-type second guard ring 208a) of the peripheral forming region are formed at the same time, the source region and the guard ring have the same impurity distribution in the depth direction.

Figure 21:
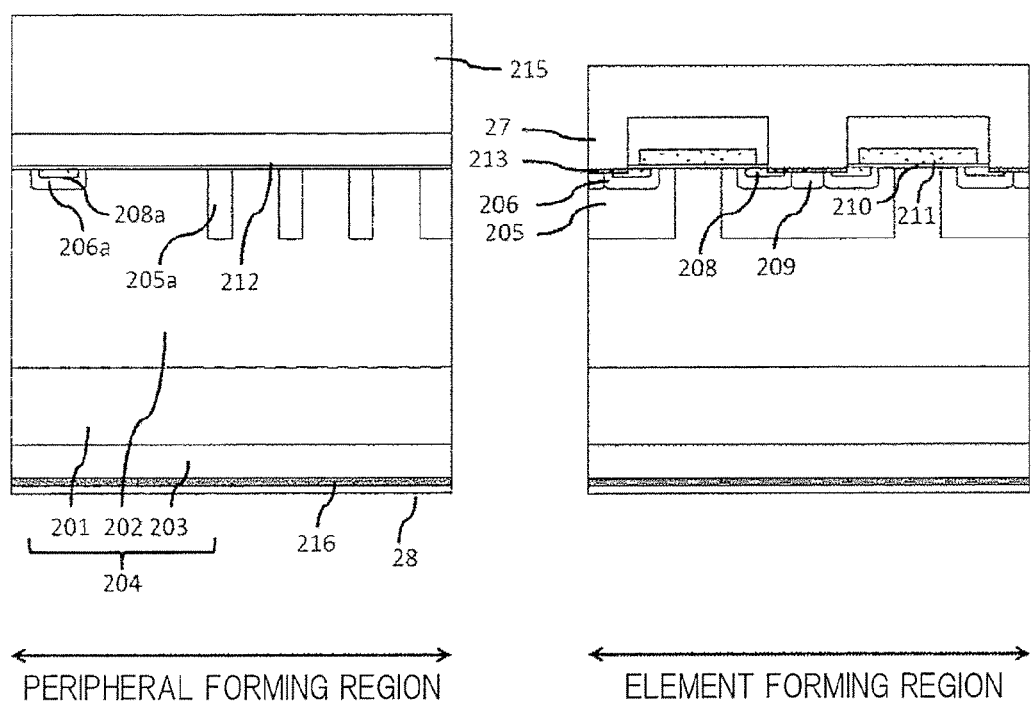
FIG. 21 is a cross-sectional view illustrating a principal part of the silicon carbide semiconductor device at the same place as that in FIG. 18 in the manufacturing process of the silicon carbide semiconductor device continued from FIG. 20.

Thereafter, as illustrated in FIG. 21, in the same manner as the first embodiment mentioned above, the p$^+$-type body layer potential fixing region 209 for fixing the potential of the p-type body layer 205, the gate insulating film 210, the gate electrode 211 and others are formed. Subsequently, after the interlayer insulating film 212 is formed on the surface of the n$^-$-type epitaxial layer 202, the opening CNT is formed in a desired region of the interlayer insulating film 212, and the metal silicide layer 213 is formed on the respective surfaces of a part of the n$^{++}$-type second source region 208, a part of the n$^+$-type first source region 206 and the p$^+$-type body layer potential fixing region 209 which are exposed on the bottom surface of the opening CNT. Next, after the opening (not illustrated) reaching the gate electrode 211 is formed in the interlayer insulating film 212, the source wiring electrode 27 electrically connected to a part of the n$^{++}$-type second source region 208 through the metal silicide layer 213 and the gate wiring electrode (not illustrated) electrically connected to the gate electrode 211 are formed. Note that the gate wiring electrode is fabricated by the same process as that of the source wiring electrode except the polycrystalline silicon film. Next, a passivation film 215 to protect the electrode is formed. Then, after the metal silicide layer 216 is formed so as to cover the n$^+$-type drain region 203 formed on the rear surface side of the n$^+$-type SiC substrate 201, the drain wiring electrode 28 is formed so as to cover the metal silicide layer 216.

As described above, according to the second embodiment, the n$^{++}$-type second source region 208 is formed inside the n$^+$-type first source region 206 so as to be separated from the end portion of the p$^+$-type body layer potential fixing region 209 and the end portion of the channel region positioned on the opposite side thereof. The impurity of the n$^+$-type first source region 206 is nitrogen, and the impurity of the n$^{++}$-type second source region 208 is phosphorus. Since phosphorus which is electrically active is implanted as an impurity at a high concentration in the second source region 208, a contact resistance can be reduced. In addition, since the n$^{++}$-type second source region 208 is formed to be shallow, the energy necessary for implanting the phosphorus is small, and the phosphorus is less diffused in the transverse direction. Therefore, the diffusion of phosphorus in the transverse direction is reduced compared to the first embodiment, so that a reduction in concentration of the p$^+$-type body layer potential fixing region 209 is more suppressed and a potential can be applied to the p-type body layer 205. In addition, since the diffusion of the phosphorus up to the channel region can be suppressed more reliably, the short channel effect causing a reduction in threshold voltage can also be suppressed. Therefore, it is possible to provide an SiC power DMOSFET which is not degraded in performance due to the transverse diffusion of the phosphorus while realizing a low contact resistance.

As described above, according to this embodiment, it is possible to provide a high-performance and reliable silicon carbide semiconductor device and a manufacturing method of the silicon carbide semiconductor device even in the case where nitrogen or the like which is hard to be diffused and has a low solid-solubility limit is used as an impurity of a source diffusion layer and phosphorus which is easy to be diffused and has a solid-solubility limit higher than that of the nitrogen is used at a high concentration as an impurity of a source diffusion layer of a contact portion. In addition, since the second source region is formed to be shallow, it is possible to obtain the higher reliability than that of the first embodiment.

(Third Embodiment)

Figure 22:
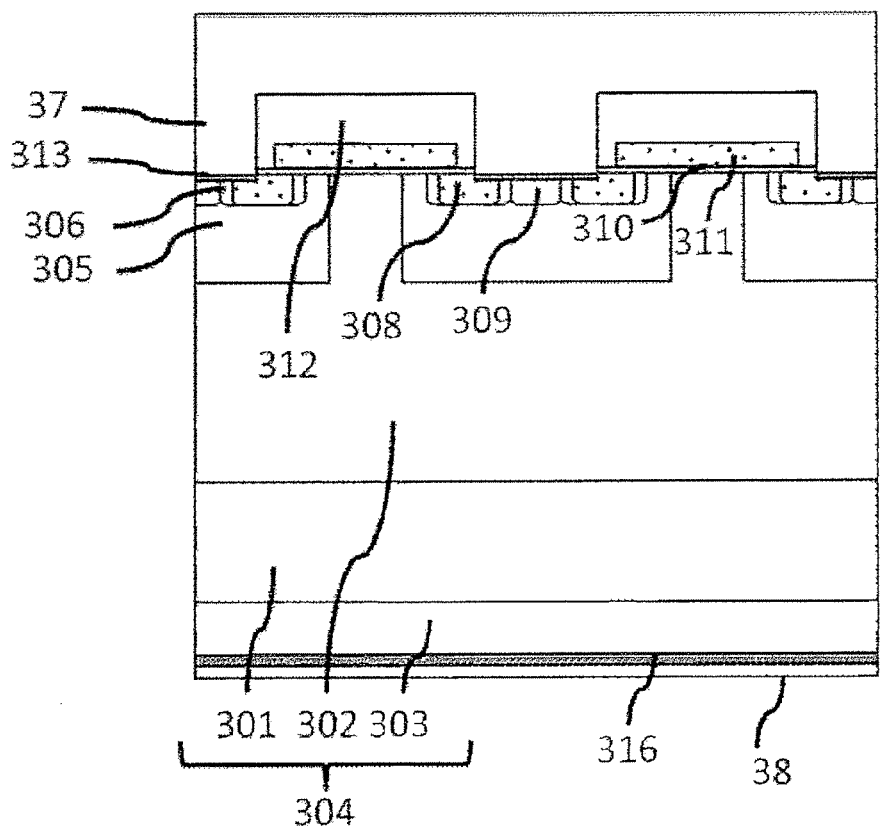
FIG. 22 is a cross-sectional view illustrating a principal part of an SiC power MISFET according to a third embodiment of the present invention.

A difference between the third embodiment and the above-mentioned first and second embodiments lies in a method of forming the source region. Namely, in the third embodiment, the depth of an n$^{++}$-type second source region 308 is made equal to the depth of an n$^+$-type first source region 306 as illustrated in FIG. 22. Note that the reference numeral 301 indicates an n$^+$-type SiC substrate (substrate), the reference numeral 302 indicates an n$^-$-type epitaxial layer, the reference numeral 303 indicates an n$^+$-type drain region, the reference numeral 304 indicates an SiC epitaxial substrate, the reference numeral 305 indicates a p-type body layer (well region), the reference numeral 309 indicates a p$^+$-type body layer potential fixing region, the reference numeral 310 indicates a gate insulating film, the reference numeral 311 indicates a gate electrode, the reference numeral 312 indicates an interlayer insulating film, the reference numeral 313 indicates a metal silicide layer, the reference numeral 37 indicates a source wiring electrode, the reference numeral 316 indicates a metal silicide film, and the reference numeral 38 indicates a drain wiring electrode.

<<Manufacturing Method of Silicon Carbide Semiconductor Device>>

A manufacturing method of the silicon carbide semiconductor device according to the third embodiment will be described in process order with reference to FIGS. 23 to 26. FIGS. 23 to 26 are cross-sectional views illustrating a principal part in which a part of the SiC power MISFET forming region (element forming region) and a part of the peripheral forming region of the silicon carbide semiconductor device are depicted in an enlarged manner.

In the same manner as the first and second embodiments mentioned above, as illustrated in FIG. 23, the n$^-$-type epitaxial layer 302 is formed on the surface (first main surface) of the n$^+$-type SiC substrate (substrate) 301, and the SiC epitaxial substrate 304 constituted of the n$^+$-type SiC substrate 301 and the n$^-$-type epitaxial layer 302 is formed. The impurity concentration of the n$^+$-type SiC substrate 301 is, for example, in a range of $1 \times 10^{18}$ to $1 \times 10^{21}$ cm$^{-3}$, and the impurity concentration of the n$^-$-type epitaxial layer 302 is, for example, in a range of $1 \times 10^{14}$ to $1 \times 10^{17}$. Subsequently, the n$^+$-type drain region 303 is formed on the rear surface (second main surface) of the n$^+$-type SIC substrate 301. The impurity concentration of the n$^+$-type drain region 303 is, for example, in a range of $1 \times 10^{19}$ to $1 \times 10^{21}$ cm$^{-3}$.

Next, a mask (not illustrated) made of, for example, an SiO$_2$ film is formed on the surface of the n$^-$-type epitaxial layer 302. Subsequently, the p-type impurity, for example, aluminum atoms (Al) is ion-implanted to the n$^-$-type epitaxial layer 302 over the mask. In this manner, the p-type body layer (well region) 305 is formed in the element forming region on the surface side of the n$^-$-type epitaxial layer 302, and a p-type ring 305a is formed in the peripheral forming region. The depth (first depth) of the p-type body layer 305 and the p-type ring 305a from the surface of the epitaxial layer 302 is, for example, about 0.5 to 2.0 µm. In addition, the impurity concentration of the p-type body layer 305 and the p-type ring 305a is, for example, in a range of $1 \times 10^{16}$ to $1 \times 10^{19}$ cm$^{-3}$.

Next, as illustrated in FIG. 23, a mask 9 (SiO$_2$ film) is formed after the mask is removed. The thickness of the mask 9 is, for example, about 0.5 to 1.5 µm. In addition, the opening portion of the mask 9 is provided not only in the element forming region but also in the peripheral forming region.

Next, nitrogen atoms (N) are ion-implanted as an n-type impurity to the n$^-$-type epitaxial layer 302 over the mask 9, so that the n$^+$-type first source region 306 is formed in the element forming region and an n$^+$-type first guard ring 306a is formed in the peripheral forming region. The depth (third depth) of the n$^+$-type first source region 306 and the n$^+$-type first guard ring 306a from the surface of the epitaxial layer 302 is, for example, about 0.1 to 0.35 µm. In addition, the impurity concentration of the n$^+$-type first source region 306 and the n$^+$-type first guard ring 306a is, for example, in a range of $1 \times 10^{18}$ to $1 \times 10^{20}$ cm$^{-3}$.

Next, as illustrated in FIG. 24, a mask 10 is formed so as to cover the mask 9 and the n$^+$-type first source region 306. The film thickness of the mask 10 is, for example, about 0.1 to 0.5 µm, and the material thereof is SiO$_2$.

Next, as illustrated in FIG. 25, the mask 10 is processed by the anisotropic dry etching method to form a sidewall made of the mask 10 on the side surface of the mask 9. Since the sidewall made of the mask 10 is formed, an area of the n$^{++}$-type second source region 308 when seen in a plan view to be formed in the subsequent process can be made smaller than that of the n$^+$-type first source region 306 when seen in a plan view. Phosphors atoms (P) are ion-implanted as an n-type impurity to the n$^-$-type epitaxial layer 302 over the sidewall made of the mask 10 and the mask 9, thereby forming the n$^{++}$-type second source region 308 and an n$^{++}$-type second guard ring 308a in the element forming region. The depth (fourth depth) of the n$^{++}$-type second source region 308 and the n$^{++}$-type second guard ring 308a from the surface of the epitaxial layer 302 is, for example, about 0.1 to 0.35 µm. In addition, the impurity concentration of the n$^{++}$-type second source region 308 and the n$^{++}$-type second guard ring 308a is, for example, in a range of $1 \times 10^{19}$ to $1 \times 10^{21}$ cm$^{-3}$.

Since the n$^{++}$-type second source region 308 and the n$^{++}$-type second guard ring 308a are formed to have the depth equal to those of the n$^+$-type first source region 306 and the n$^+$-type first guard ring 306a, an n$^{++}$-type third source region is formed in an overlapped portion between the n$^+$-type first source region 306 and the n$^{++}$-type second source region 308. At this time, the third source region and the second source region are formed in common. Since the n$^{++}$-type second guard ring 308a is formed to have the depth equal to that of the n$^+$-type first guard ring 306a, the n$^{++}$-type third guard ring is formed in an overlapped portion between the n$^+$-type first guard ring 306a and the n$^{++}$-type second guard ring 308a. At this time, the third guard ring and the second guard ring 308a are formed in common. In the third embodiment, since the source region (the n$^+$-type first source region 306 and the n$^{++}$-type second source region 308) of the element forming region and the guard ring (the n$^+$-type first guard ring 306a and the n$^{++}$-type second guard ring 308a) of the peripheral forming region are formed at the same time, the source region and the guard ring have the same impurity distribution in the depth direction.

Thereafter, as illustrated in FIG. 26, in the same manner as the first and second embodiments mentioned above, the p$^+$-type body layer potential fixing region 309 for fixing the potential of the p-type body layer 305, the gate insulating film 310, the gate electrode 311 and others are formed. Subsequently, after the interlayer insulating film 312 is formed on the surface of the n$^-$-type epitaxial layer 302, the opening CNT is formed in a desired region of the interlayer insulating film 312, and the metal silicide layer 313 is formed on the respective surfaces of a part of the n$^+$-type second source region 308, a part of the n$^+$-type first source region 306 and the p$^+$-type body layer potential fixing region 309 which are exposed on the bottom surface of the opening CNT. Next, after the opening (not illustrated) reaching the gate electrode 311 is formed in the interlayer insulating film 312, the source wiring electrode 37 electrically connected to a part of the n$^{++}$-type second source region 308 through the metal silicide layer 313 and the gate wiring electrode (not illustrated) electrically connected to the gate electrode 311 are formed. Next, a passivation film 315 to protect the electrode is formed. Then, after the metal silicide layer 316 is formed so as to cover the n$^+$-type drain region 303 formed on the rear surface side of the n$^+$-type SiC substrate 301, the drain wiring electrode 38 is formed so as to cover the metal silicide layer 316.

As described above, according to the third embodiment, the n$^{++}$-type second source region 308 is formed inside the n$^+$-type first source region 306 so as to be separated from the end portion of the p$^+$-type body layer potential fixing region 309 and the end portion of the channel region positioned on the opposite side thereof. The impurity of the n$^+$-type first source region 306 is nitrogen, and the impurity of the n$^{++}$-type second source region 308 is phosphorus. Since phosphorus which is electrically active is implanted as an impurity at a high concentration in the second source region 308, a contact resistance can be reduced. In addition, since the first source region 306 and the second source region 308 are deeply formed to have the same depth, the sheet resistance can also be reduced. In addition, since the n$^{++}$-type second source region 308 is formed to be separated from the p$^+$-type body layer potential fixing region 309 and the channel, even when the phosphorus as the impurity of the second source region 308 is diffused in the transverse direction, a potential can be applied to the p-type body layer 305 without reducing the concentration of the p$^+$-type body layer potential fixing region 309. In addition, since the phosphorus is not diffused up to the channel region, a short channel effect causing a reduction in threshold voltage does not occur. Therefore, it is possible to provide an SiC power DMOSFET which is not degraded in performance due to the transverse diffusion of the phosphorus while realizing a low contact resistance.

As described above, according to this embodiment, it is possible to provide a high-performance and reliable silicon carbide semiconductor device and a manufacturing method of the silicon carbide semiconductor device even in the case where nitrogen or the like which is hard to be diffused and has a low solid-solubility limit is used as an impurity of a source diffusion layer and phosphorus which is easy to be diffused and has a solid-solubility limit higher than that of the nitrogen is used at a high concentration as an impurity of a source diffusion layer of a contact portion.

In the foregoing, the present invention has been described in detail, and the main embodiments of the invention will be enumerated below.

The embodiment relates to an SiC power MISFET in which a p-type body layer is formed in an n-type epitaxial layer formed on a front surface side of a substrate, a source region, a body layer potential fixing region and a channel region are formed in the p-type body layer, a gate insulating film is formed to be in contact with the channel region, a gate electrode is formed to be in contact with the gate insulating film, and an n-type drain region is formed on a rear surface side of the substrate. The source region is constituted of an n-type first source region which contains nitrogen as an impurity, an n-type second source region which is formed in the first source region at a position separated from the channel and the body layer potential fixing region and contains phosphorus as an impurity, and a third source region in which the first source region and the second source region are overlapped.

The embodiment relates to a manufacturing method of an SiC power MISFET including the following steps. An n-type epitaxial layer is formed on a front surface side of a substrate, and an n-type drain region is formed on a rear surface side of the substrate. After a p-type body layer having a first depth from a surface of the epitaxial layer is formed in the epitaxial layer with using a first mask, nitrogen is implanted into the body layer with using a second mask to form a first source region having a third depth from the surface of the epitaxial layer, a third mask is formed on the surface of the epitaxial layer so as to cover the second mask, and a sidewall made of the third mask is formed on a side surface of the second mask by processing the third mask by dry etching. Subsequently, phosphorus is implanted into the first source region with using the second mask and the sidewall of the third mask formed on the side surface of the second mask, thereby forming a second source region having a fourth depth from the surface of the epitaxial layer and simultaneously forming a third source region having a fifth depth in which the first source region and the second source region are overlapped. Sequentially, a p-type body layer potential fixing portion having a second depth from the surface of the epitaxial layer is formed with using a fourth mask.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, materials, conductivity types, manufacturing conditions and others of the respective parts are not limited to those described in the embodiments above, and it is a matter of course that various modifications can be made thereto. Herein, for the sake of explanation, the description has been made on the assumption that the conductivity types of the semiconductor substrate and the semiconductor film are fixed, but the conductivity types are not limited to those described in the embodiments above.

INDUSTRIAL APPLICABILITY

The present invention can be applied to a silicon carbide power semiconductor device which is used for high breakdown voltage and large current.

EXPLANATION OF REFERENCE CHARACTERS 1 semiconductor chip
2 active region (SiC power MISFET forming region, element forming region)
3 p-type floating field limiting ring
4 n$^+$-type guard ring
5 gate wiring electrode
6 opening
7 source wiring electrode
8 drain wiring electrode
27 source wiring electrode
28 drain wiring electrode
37 source wiring electrode
38 drain wiring electrode
101 n$^+$-type SiC substrate (substrate)
102 n$^-$-type epitaxial layer
103 n$^+$-type drain region
104 SiC epitaxial substrate
105 p-type body layer (well region)
105a p-type floating field limiting ring
106 n$^+$-type first source region
106a n$^+$-type first guard ring
107 n$^{++}$-type second source region
107a n$^{++}$-type second guard ring 108 n++-type third source region
108a n++-type third guard ring
109 p+-type body layer potential fixing region
110 gate insulating film
111 gate electrode
111A n-type polycrystalline silicon film
112 interlayer insulating film
113 metal silicide layer
115 passivation film
116 metal silicide layer
201 n+-type SiC substrate (substrate)
202 n−-type epitaxial layer
203 n+-type drain region
204 SiC epitaxial substrate
205 p-type body layer (well region)
205a p-type floating field limiting ring
206 n+-type first source region
206a n+-type first guard ring
208 n+-type second source region
208a n++-type second guard ring
209 p+-type body layer potential fixing region
210 gate insulating film
211 gate electrode
212 interlayer insulating film
213 metal silicide layer
215 passivation film
216 metal silicide layer
301 n+-type SiC substrate (substrate)
302 n−-type epitaxial layer
303 n+-type drain region
304 SIC epitaxial substrate
305 p-type body layer (well region)
305a p-type floating field limiting ring
306 n+-type first source region
306a n++-type first guard ring
308 n++-type second source region
308a n++-type second guard ring
309 p+-type body layer potential fixing region
310 gate insulating film
311 gate electrode
312 interlayer insulating film
313 metal silicide layer
315 passivation film
316 metal silicide film
mask 1-10 mask

The invention claimed is:

1. A silicon carbide semiconductor device comprising:
a substrate of a first conductivity type which includes a first main surface and a second main surface which is an opposite surface of the first main surface and is made of silicon carbide;
an epitaxial layer which is formed on the first main surface of the substrate and made of silicon carbide;
a body layer of a second conductivity type different from the first conductivity type, which has a first depth from a surface of the epitaxial layer and is formed in the epitaxial layer;
a body layer potential fixing region of the second conductivity type, which has a second depth from the surface of the epitaxial layer and is formed in the epitaxial layer;
a first source region of the first conductivity type, which has a third depth from the surface of the epitaxial layer and is formed in the body layer so as to be separated from an end portion of the body layer and to be adjacent to the body layer potential fixing region, and to which a first impurity is introduced;
a second source region of the first conductivity type, which has a fourth depth from the surface of the epitaxial layer and is formed inside the first source region on a side of the end portion of the body layer and is further formed inside the first source region so as to be separated from the body layer potential fixing region on a side of the body layer potential fixing region, and to which a second impurity which has a solid-solubility limit higher than that of the first impurity and is easily diffused is introduced;
a third source region of the first conductivity type, which has a fifth depth from the surface of the epitaxial layer and is formed of the first source region and the second source region overlapped with each other;
a source diffusion layer region including the first source region, the second source region and the third source region;
a channel region formed in the body layer between the end portion of the body layer and the first source region;
a gate insulating film formed to be in contact with the channel region;
a gate electrode formed to be in contact with the gate insulating film; and
a drain region of the first conductivity type, which has a sixth depth from the second main surface of the substrate and is formed in the substrate.

2. The silicon carbide semiconductor device according to claim 1,
wherein the first impurity of the first source region is nitrogen, the second impurity of the second source region is phosphorus, and an impurity of the third source region includes nitrogen and phosphorus.

3. The silicon carbide semiconductor device according to claim 1,
wherein the third depth of the first source region is shallower than the fourth depth of the second source region.

4. The silicon carbide semiconductor device according to claim 3,
wherein the third depth of the first source region is 0.05 μm to 0.25 μm, and the fourth depth of the second source region is 0.1 μm to 0.35 μm.

5. The silicon carbide semiconductor device according to claim 1,
wherein a concentration of an electrically active impurity is higher in the third source region than in the second source region and is higher in the second source region than in the first source region.

6. The silicon carbide semiconductor device according to claim 1,
wherein an impurity of the first source region is nitrogen and a concentration of an electrically active impurity is $1\times10^{18}$ cm$^{-3}$ to $1\times10^{20}$ cm$^{-3}$, and
wherein an impurity of the second source region is phosphorus and a concentration of an electrically active impurity is $1\times10^{19}$ cm$^{-3}$ to $1\times10^{21}$ cm$^{-3}$.

7. The silicon carbide semiconductor device according to claim 1,
wherein the second source region on a side of the end portion of the body layer is separated from an end portion of the first source region by 0.1 μm to 0.5 μm, and the second source region on a side of the body layer potential fixing region is formed to be separated from the end portion of the first source region by 0.1 μm to 0.5 μm.

8. The silicon carbide semiconductor device according to claim 1, further comprising:

a guard ring of the first conductivity type formed in a peripheral portion of the epitaxial layer,
wherein the source diffusion layer region and the guard ring have the same impurity concentration distribution.

9. The silicon carbide semiconductor device according to claim 1,
wherein the third depth of the first source region is deeper than the fourth depth of the second source region.

10. The silicon carbide semiconductor device according to claim 9,
wherein an impurity of the first source region is nitrogen, the second source region and the third source region are overlapped, and impurities of the second source region and the third source region are nitrogen and phosphorus.

11. The silicon carbide semiconductor device according to claim 1,
wherein the third depth of the first source region is equal to the fourth depth of the second source region, and the second source region and the third source region are in the same layer.

12. The silicon carbide semiconductor device according to claim 11,
wherein an impurity of the first source region is nitrogen, the second source region and the third source region are overlapped, and impurities of the second source region and the third source region are nitrogen and phosphorus.

13. A silicon carbide semiconductor device which uses a silicon carbide substrate and includes a plurality of power semiconductor devices,
wherein, in the power semiconductor device,
a drift layer of a first conductivity type, a body layer of a second conductivity type different from the first conductivity type in which a channel is formed, a source region of the first conductivity type, and a body layer potential fixing region of the second conductivity type which fixes a potential of the body layer are arranged in this order in a channel length direction on a surface of a region made of silicon carbide,
a gate insulating film and a gate electrode are stacked on the body layer,
the drift layer is connected to a drain region of the first conductivity type, and
a region having a high nitrogen concentration and a region having a high phosphorus concentration are arranged in the channel length direction in the source region, and the body layer and the region having the high nitrogen concentration are in contact with each other,
wherein a region having a high nitrogen concentration, a region having a high phosphorus concentration and a region having a high nitrogen concentration are arranged in the channel length direction in the source region.

14. A manufacturing method of a silicon carbide semiconductor device, comprising the steps of:
(a) forming an epitaxial layer of a first conductivity type made of silicon carbide on a first main surface of a substrate of the first conductivity type made of silicon carbide;
(b) forming a drain region of the first conductivity type having a sixth depth from a second main surface of the substrate in the second main surface which is an opposite surface of the first main surface of the substrate;
(c) forming a first mask on a surface of the epitaxial layer so as to cover a part of the epitaxial layer and implanting an impurity of the second conductivity type to the epitaxial layer exposed from the first mask, thereby forming a body layer having a first depth from the surface of the epitaxial layer in the epitaxial layer;
(d) forming a second mask on a surface of the body layer so as to cover a part of the body layer and implanting a first impurity of the first conductivity type to the body layer exposed from the second mask, thereby forming a first source region having a third depth from the surface of the epitaxial layer in the body layer;
(e) forming a third mask on the surface of the epitaxial layer so as to cover the second mask;
(f) forming a sidewall made of the third mask on a side surface of the second mask by processing the third mask by anisotropic dry etching and forming the third mask made of the sidewall on the surface of the epitaxial layer so as to cover a part of the first source region; and
(g) implanting an impurity of the first conductivity type, which has a solid-solubility limit higher than that of the first impurity and is easily diffused, to the epitaxial layer where the body layer exposed from the second mask is formed, thereby forming a second source region having a fourth depth from the surface of the epitaxial layer.

* * * * *

UNITED STATES PATENT AND TRADEMARK OFFICE
CERTIFICATE OF CORRECTION

PATENT NO. : 9,490,328 B2  
APPLICATION NO. : 14/897247  
DATED : November 8, 2016  
INVENTOR(S) : Naoki Tega et al.

Page 1 of 1

It is certified that error appears in the above-identified patent and that said Letters Patent is hereby corrected as shown below:

On the Title Page

Item (22) "PCT Filed", please delete "Jun. 6, 2013" and insert instead --Jun. 26, 2013--.

Signed and Sealed this  
Twenty-fifth Day of April, 2017

Michelle K. Lee  
*Director of the United States Patent and Trademark Office*